United States Patent
Han et al.

(10) Patent No.: US 10,588,223 B2
(45) Date of Patent: Mar. 10, 2020

(54) DISPLAY DEVICE

(71) Applicant: LG Electronics Inc., Seoul (KR)

(72) Inventors: Jihoon Han, Seoul (KR); Kitae Kang, Seoul (KR); Jinha Heo, Seoul (KR); Dohyeon Kim, Seoul (KR); Hyunjong Ryu, Seoul (KR); Jaeho Kim, Seoul (KR); Inkeun Ryu, Seoul (KR); Namhyeon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/141,359

(22) Filed: Sep. 25, 2018

(65) Prior Publication Data
US 2019/0029131 A1     Jan. 24, 2019

Related U.S. Application Data

(63) Continuation of application No. 14/939,189, filed on Nov. 12, 2015, now Pat. No. 10,111,344.

(30) Foreign Application Priority Data

Jul. 7, 2015  (KR) .................. 10-2015-0096317
Jul. 7, 2015  (KR) .................. 10-2015-0096318

(51) Int. Cl.
*H05K 5/00*    (2006.01)
*G09F 9/30*    (2006.01)
(Continued)

(52) U.S. Cl.
CPC .......... *H05K 5/0017* (2013.01); *G09F 9/301* (2013.01); *G09F 15/0062* (2013.01);
(Continued)

(58) Field of Classification Search
CPC .... H05K 5/0017; H05K 1/028; H05K 5/0217; H05K 5/03; H05K 7/1427; H05K 2201/051; G09F 9/301
(Continued)

(56) References Cited

U.S. PATENT DOCUMENTS 9,098,241 B1 *   8/2015   Cho .................. H05K 1/028
2005/0040962 A1   2/2005   Funkhouser et al.
(Continued)

FOREIGN PATENT DOCUMENTS

EP           2538400 A1    12/2012
WO       2006/038171 A1    4/2006
(Continued)

*Primary Examiner* — Michael P McFadden
(74) *Attorney, Agent, or Firm* — Dentons US LLP

(57) ABSTRACT

A display device that includes a housing with at least one Printed Circuit Board (PCB) and a plurality of rollers disposed in the housing. The display device also includes a display unit which, in turn, includes a display panel and a module cover. The display device further includes a driving unit that is connected to the display panel and the module cover. The driving unit moves the display panel and the module cover between a first state and a second state. In the first state, the panel and module cover are wound around at least one of the plurality of rollers, and in the second state they are unwound from the at least one of the plurality of rollers and exposed by being drawn out from the housing.

21 Claims, 47 Drawing Sheets

(51) Int. Cl.
  *G09F 15/00*  (2006.01)
  *H05K 1/02*  (2006.01)
  *H05K 5/02*  (2006.01)
  *H05K 5/03*  (2006.01)
  *H05K 7/14*  (2006.01)

(52) U.S. Cl.
  CPC ........... *H05K 1/028* (2013.01); *H05K 5/0217* (2013.01); *H05K 5/03* (2013.01); *H05K 7/1427* (2013.01); *H05K 2201/051* (2013.01)

(58) Field of Classification Search
  USPC ......................................................... 361/749
  See application file for complete search history.

(56) References Cited

U.S. PATENT DOCUMENTS

| | | | |
|---|---|---|---|
| 2011/0278414 A1* | 11/2011 | Theis | F16M 11/18 248/297.11 |
| 2012/0002357 A1* | 1/2012 | Auld | G09F 9/33 361/679.01 |
| 2013/0127799 A1 | 5/2013 | Lee | |
| 2016/0161983 A1* | 6/2016 | Lee | G06F 1/1652 361/749 |

FOREIGN PATENT DOCUMENTS

| | | | |
|---|---|---|---|
| WO | 2008/133510 A2 | 11/2008 | |
| WO | 2009/067010 A2 | 5/2009 | |

* cited by examiner (a)

T:Torque, W:Weight (b)

T:Torque, W:Weight (a)

(b)

DISPLAY DEVICE

This application is a continuation of U.S. patent application Ser. No. 14/939,189 filed on Nov. 12, 2015, which claims the benefit of Korean Patent Application No. 10-2015-0096317 filed on Jul. 7, 2015, and No. 10-2015-0096318 filed on Jul. 7, 2015, the entire contents of which are incorporated herein by reference for all purposes as if fully set forth herein.

BACKGROUND OF THE INVENTION

Field of the Invention

The present invention relates to a display device and, more particularly, to a display device which is enabled to wind and unwind a module cover and a display panel without any support structure.

Discussion of the Related Art

Due to the development of the information society, there are increasing demands for various display devices. In response, many efforts have been made recently to study and use a Liquid Crystal Display Device (LCD), a Plasma Display Panel (PDP), an Electro Luminescent Display (ELD), Vacuum Fluorescent Display (VFD), and the like.

Among these display devices, an Organic Light Emitting Diode (OLED) has a notable advantage since it is excellent in luminance and a viewing angle compared to the LCD. In addition, the OLED does not need a black light unit and thus it can be realized to be ultra-thin.

SUMMARY OF THE INVENTION

In one general aspect, there is provided a display device that comprises a housing having at least one Printed Circuit Board (PCB) and a plurality of rollers disposed in the housing. The display device also comprises a display unit which includes a display panel and a module cover. Still further, the display device comprises a driving unit connected to the display panel and the module cover so as to cause the display panel and the module cover to move from a first state to a second state. In the first state, they are wound around at least one of the plurality of rollers, and in the second state they are unwound from the at least one of the plurality of rollers and exposed by being drawn out from the housing, wherein the module cover is, in the first state, wound around at least one other of the plurality of rollers, and, in the second state, unwound from the at least one other of the plurality of rollers to contact a rear surface of the display panel.

The display device may further include an elastic piece disposed on the module cover in a minor axis direction of the display unit and configured to strengthen the display unit in the second state.

There may be a plurality of elastic pieces, and the plurality of elastic pieces are spaced apart from each other.

The plurality of elastic pieces may include a first elastic piece and a second elastic piece which are at an equal distance from a center of the module cover in a major axis direction.

The plurality of elastic pieces may further include a third elastic piece disposed between the first and second elastic pieces and in the center of the module cover.

The elastic piece is bendable in a thickness direction of the display unit.

The display device may further include an elastic piece roller configured to wind and unwind the elastic piece within the housing, and an insertion guide disposed where the elastic piece starts to be unwound from the elastic piece roller and configured to press both sides of the elastic piece so as to cause the elastic piece to be bent in a thickness direction of the display unit.

The insertion guide may include a jig composing a body of the insertion guide; a pin member projected from a body of the jig toward a groove of the module cover, into which the elastic piece is inserted, so as to press the both ends of the elastic piece; and a fixing member being spaced apart from the jig and disposed at a center of the groove so as to push a center of the elastic piece outward from the groove.

The module cover may include a plurality of aprons, wherein at least a portion of a first apron is connected to a second apron.

The display device may further include a stand guide disposed proximate to the module cover, the display panel, and the housing.

The driving unit may include a motor assembly; a pinion gear connected to the motor assembly through a chain and having a circumference in a toothed shape; and a rack gear having a concave-convex pattern on the module cover.

There may be a plurality of rack gears, where the plurality of rack gears are at an equal distance from a center of the module cover in a major axis direction.

The concave-convex pattern of the rack gear is engaged with teeth of the pinion gear.

The plurality of rollers may include a panel roller configured to wind and unwind the display panel, and an apron roller configured to wind and unwind the module cover in association with winding and unwinding of the display panel.

The display device may further comprise at least two more PCBs in addition to the at least one PCB, which collectively include a timing controller board, a main board, and a power supply, and wherein the timing controller board is mounted in the panel roller at least one PCB may include a timing controller board, a main board, and a power supply, and the controller board may be mounted in the panel roller.

The panel roller may include a settling part which is disposed inward of the circumference of the panel roller.

At least part of the settling part may be in contact with a source PCB disposed in a lower part of the display panel.

The display device may further comprise at least two more PCBs in addition to the at least one PCB, which collectively include a timing controller board, a main board, and a power supply, and wherein the panel roller comprises a top panel roller and a bottom panel roller with the timing controller board mounted there between.

The display device may further comprise at least two more PCB's in addition to the at least one PCB, which collectively include a timing controller board, a main board, and a power supply, wherein the timing controller board is connected to the main board and the power supply, both of which are disposed so that the display panel is between the main board and the power supply and the timing controller board in the first state, through a first wiring electrode and a second wiring electrode respectively, and wherein the first wiring electrode and the second wiring electrode are wound multiple times in the first state.

The display device may further comprise at least two more PCBs in addition to the at least one PCB, which collectively include a timing controller board, a main board, and a power supply, wherein the timing controller board comprises a timing controller and a board cover which covers the timing controller to prevent noise.

The display panel may be disposed inside the housing in the first state, and external to the housing in the second state.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
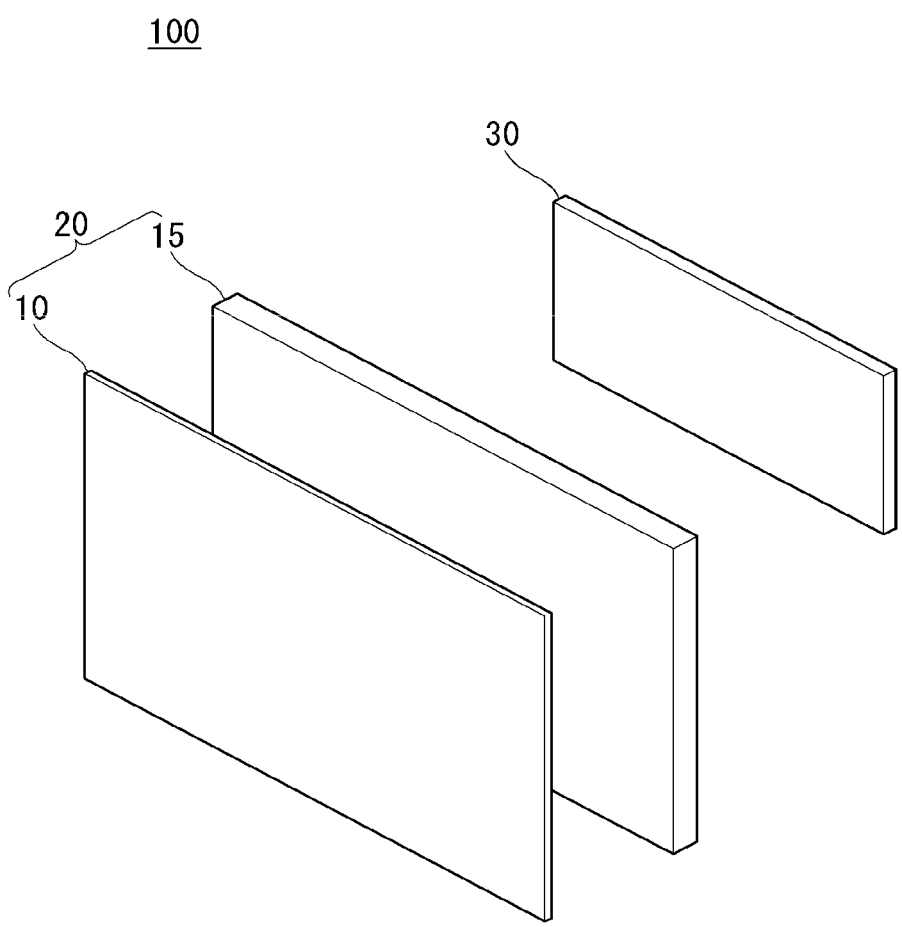
FIGS. 1 to 6 are diagrams illustrating a configuration of a display device related to the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, an Organic Light Emitting Display (OLED) is described as an example of a display panel, but a type of a display panel which can be applied to the present invention is not limited to the OLED. That is, examples of the display panel may include a Liquid Crystal Display Device (LCD), a Plasma Display Panel (PDP), and a Field Emission Display (FED).

FIGS. 1 to 6 are diagrams illustrating a configuration of a display device related to the present invention.

Referring to FIG. 1, a display device 100 according to the present invention may include a display unit 20 and a housing 30.

The display unit 20 may include a display panel 10 and a module cover 15. The display panel 10 is provided on the front surface of the display device 100 and may display an image. The display panel 10 may output an image by dividing an image into a plurality of pixels and controlling each of the pixels to emit light with the same color, brightness, and saturation. The display panel 10 may be divided into an activated area displaying an image and an inactivated area not displaying the image.

The display panel 10 may be in a rectangular shape. However, aspects of the present invention are not limited thereto. For example, the display panel 10 may be in a shape having edges of predetermined curvature. The display panel 10 may be an OLED panel. However, aspects of the present invention are not limited thereto. For example, the display panel 10 may be a LCD panel.

The module cover 15 may be disposed on the rear surface of the display panel 10. The module cover 15 may be attached directly on the display panel 10. The module cover 15 may be as large as the display panel 10 or may be larger than the display panel 10.

The module cover 15 may support the rear surface of the display panel 10. Accordingly, the module cover 15 may include a material which is light but has great strength.

The housing 30 may be provided on the rear surface of the display unit 20. That is, the housing 30 may be provided on the rear surface of the module cover 15. The housing 30 may cover at least one Printed Circuit Board (PCB). That is, the housing 30 may cover at least one PCB attached on the rear surface of the module cover 15. The combination structure and method of at least one PCB is described in detail in the following.

Electronic waves emitted from at least one PCB may be transmitted to the housing 30. Accordingly, although not illustrated in the drawings, the housing 30 may consist of an inner housing made of a conductive material and an outer housing covering the inner housing. However, aspects of the present invention are not limited thereto, and the housing 30 may consist of one conductive material.

Figure 2:
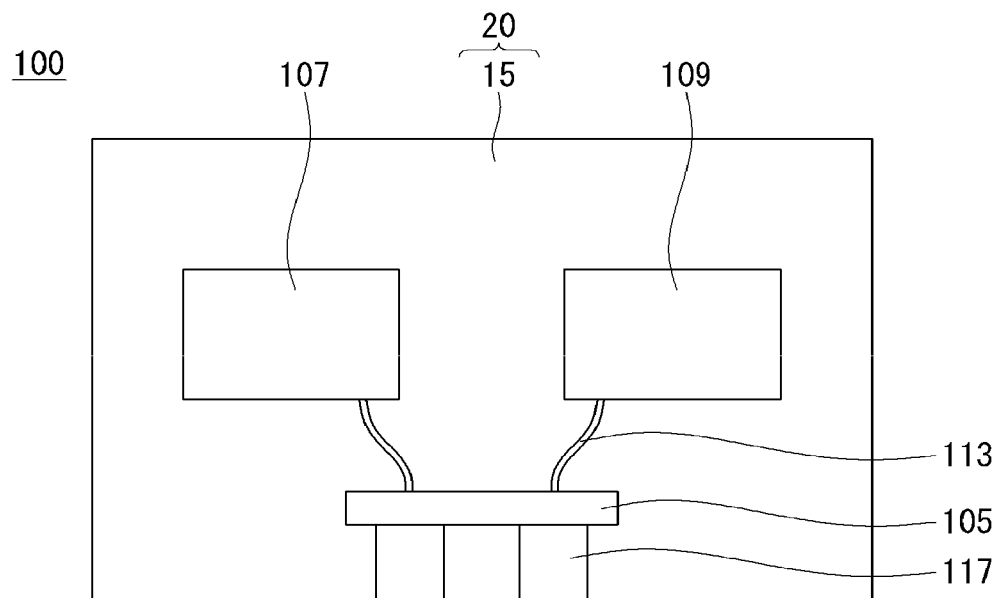
Figure 2:
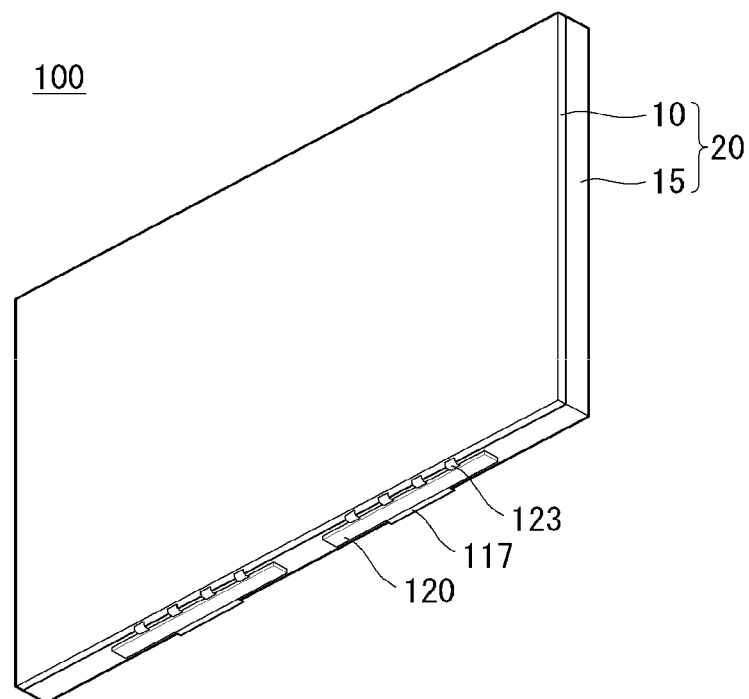

Referring to FIG. 2, at least one PCB may be disposed in at least some portion of the rear surface of the module cover 15. Each PCB may be spaced apart from one another.

Each PCB may perform a different function. For example, at least one PCB may be a main board 109. The main board 109 may provide an interface that helps the display 100 to operate. In addition, the main board 109 checks and manages an operational state of each component of the display device 100 so as to keep the display device 100 in the optimal state.

In another example, at least one PCB may be a power supply 107. The power supply 107 may supply power to the display device 100. The power supply 107 may change an alternating current (AC) frequency into a direct current (DC) frequency. That is, the power supply 107 changes a low frequency to a high frequency, thereby improving electricity efficiency.

The main board 109 and the power supply 107 may be spaced apart from each other at a predetermined interval. For example, the main board 109 and the power supply 107 may be disposed to face each other by the reference to the center of the module cover 15 in the major axis direction of the display device 100.

In yet another example, at least one PCB may be a timing controller board 105. The timing controller board 105 may transmit an input signal to the display panel 10. That is, the timing controller board 105 may transmit timing signals (CLK, LOAD, and SPi) for controlling a source PCB 120, and video signals (R, G, and B) to the source PCB 120. The timing controller board 105 may be connected to the source PCB 120 through a Flat Flex Cable (FFC) 117.

On the source PCB 120, there may be signal lines disposed to transmit digital video data and timing control signals, which are received from the timing controller board 105. The source PCB 120 may be connected to the display panel 10 through a Chip on Film (COF) 123.

The source COF 123 may be electrically connected to the source PCB 120 and data pads of the display panel 10. The source COF 123 may have a data integrated circuit mounted therein.

The main board 109 and the power supply 107 may be connected to the controller board 105 through a wiring electrode 113. In addition, the main board 109 and the power supply 107 may be electrically connected to each other through the wiring electrode 113.

Figure 3:
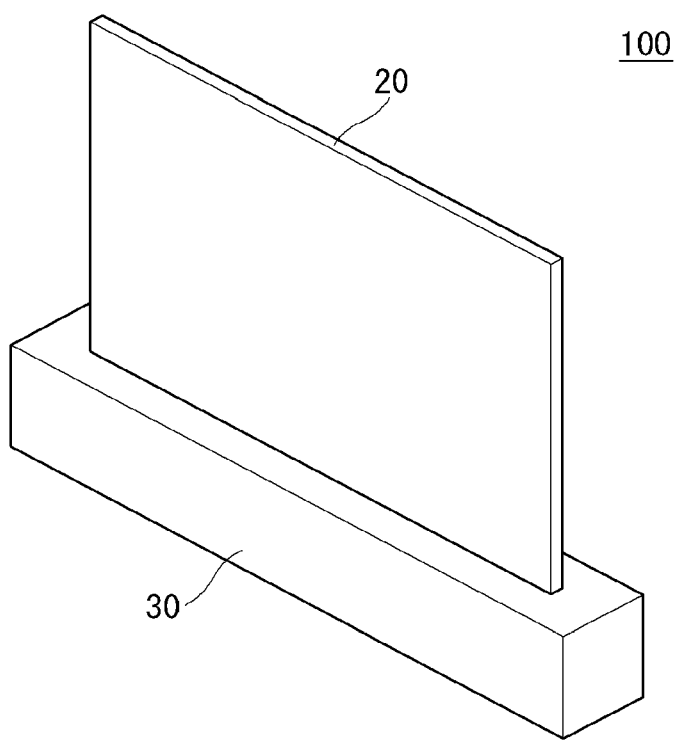

Referring to FIG. 3, the housing 30 of the display device 100 may be disposed below the display unit 20. Specifically, the housing 30 may embrace the lower part of the display unit 20. The housing 30 may prevent various inner driving devices or driving circuits from being exposed, The width of the housing 30 in the first and second directions may be longer than that of the display unit 20 in order to protect the inner space of the display unit 20. The width of the housing 30 in the third direction may be shorter than that of the display unit 20 not to disturb a user's viewing.

In the display device 100 according to the present invention, the housing 30 may not be disposed in an activated area of the display unit 20. Accordingly, users are able to immerse themselves in a thinner screen of the display unit 20.

Figure 4:
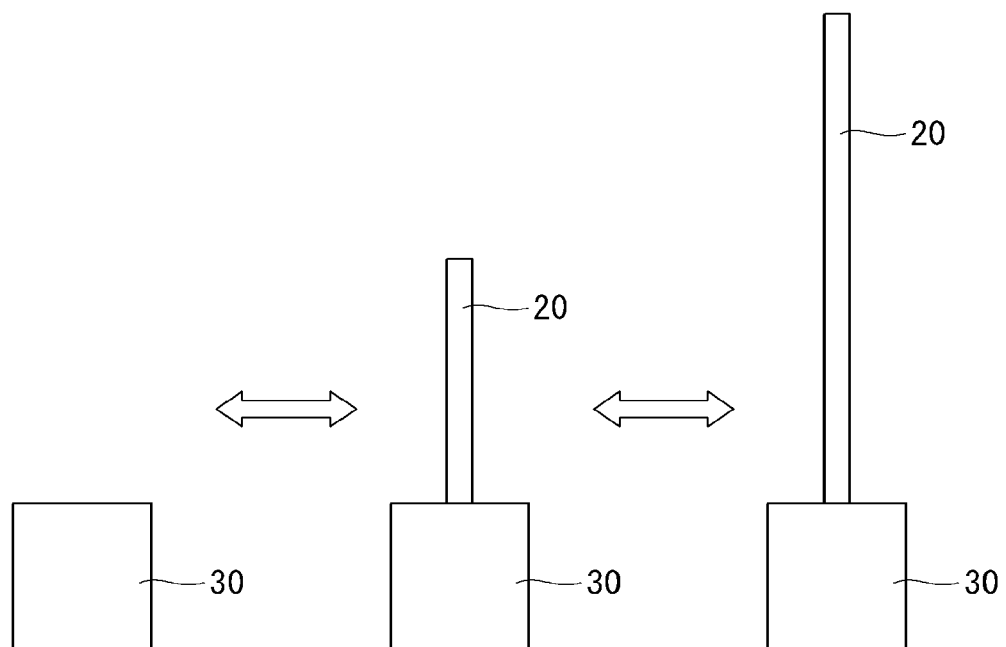

Referring to FIG. 4, the display device 100 according to the present invention may be in a first state in which an activated area of the display unit 20 is disposed inside the housing 30, or in a second state in which the activated area of the display unit 20 is exposed from the housing 30.

In the first state, the activated area of the display unit 20 may be disposed inside the housing 30. That is, the display 20 may be covered by the housing 30.

In the second state, the activated area of the display unit 20 may be exposed from the housing 30. That is, at least some portion of the display unit 20 may be projected over the top surface of the housing 30 in the second state.

Although not illustrated in the drawings, the display unit 20 may be shifted from the first state to the second state by a roller located inside the housing 30. Specifically, if a roller is unrolling, the first state in which the display unit 20 is wound may be shifted to the second state in which the display unit 20 is exposed. Alternatively, if an unrolled roller is rolling, the display unit 20 may be shifted from the second state to the first state. The configurations of the roller and the display unit 20, and operating methods thereof are described in detail in the following.

In the display device 100 according to the present invention, the display unit 20 may be either in the first state or in the second state. Accordingly, to save a space, a user may let the display unit 20 be exposed from the housing 30 only when watching contents on the display device 100.

Figure 5:
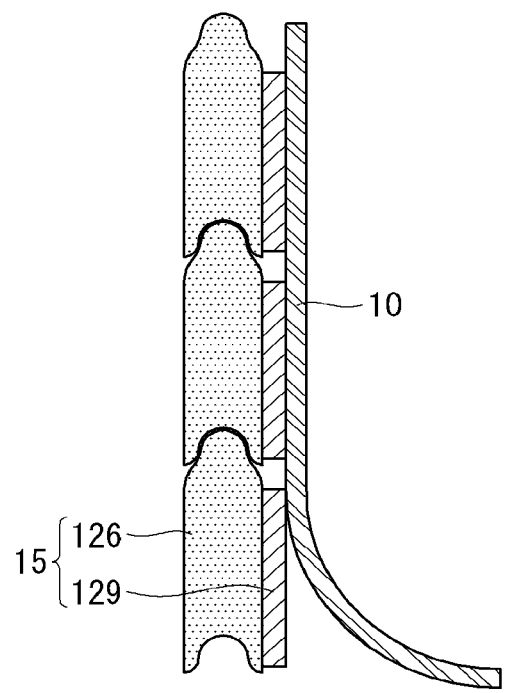

Referring to FIG. 5, in the display device 100 according to the present invention, the module cover 15 may include a plurality of aprons 126, wherein at least a portion of each apron 126 is connected to a different apron.

A magnet 129 may be disposed on at least one apron 126. Each magnet 129 may be attached to each apron using a double-sided tape. The magnet 129 may help the apron 126 and the display panel 10 to be combined with each other. Magnets 129 may be spaced apart from each other. Accordingly, when the module cover 15 is wound or unwound by the roller, the shape of the module cover 15 may be changed easily.

The display panel 10 may be attached on the magnet 129. A surface of the display panel 10 which is in contact with the magnet 129 may include a Fe—Ni Invar alloy. Accordingly, the display panel 10 may be strongly attached to the magnet 129, In the display device 100 according to the present invention, the module cover 15 may include a plurality of aprons 126 and a plurality of magnets 129. Accordingly, when the module cover 15 is wound by the roller, the shape of the module cover 15 may be changed more easily compared to the case where there is provided only a single module cover 15.

Figure 6:
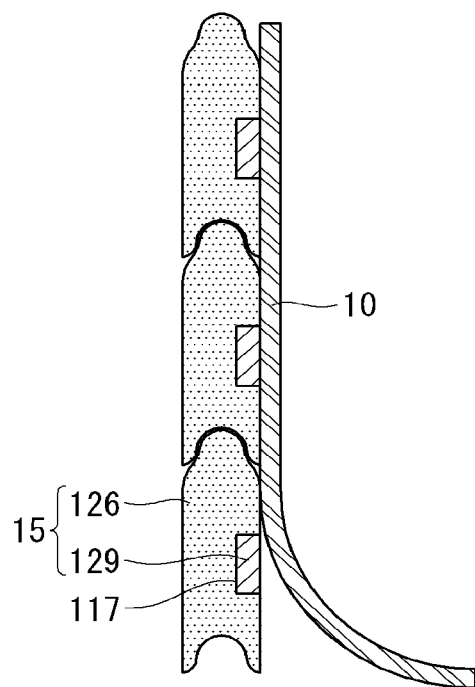

Referring to FIG. 6, in the display device 100 according to the present invention, the magnet 129 may be disposed inside a recess 117 of the apron 126.

The recess 117 may be disposed on one side of the apron 126 which faces the display panel 10, Since the magnet 129 is disposed inside the recess 117, the apron 126 may have a flat surface which is in contact with the display panel 10, In the display device 100 according to the present invention, the module cover 15 may have a flat surface which is in contact with the display panel 10. Accordingly, the display panel 10 does not have a step but become flat.

FIGS. 7 to 18 are diagrams illustrating a display device according to an exemplary embodiment of the present invention.

Figure 7:
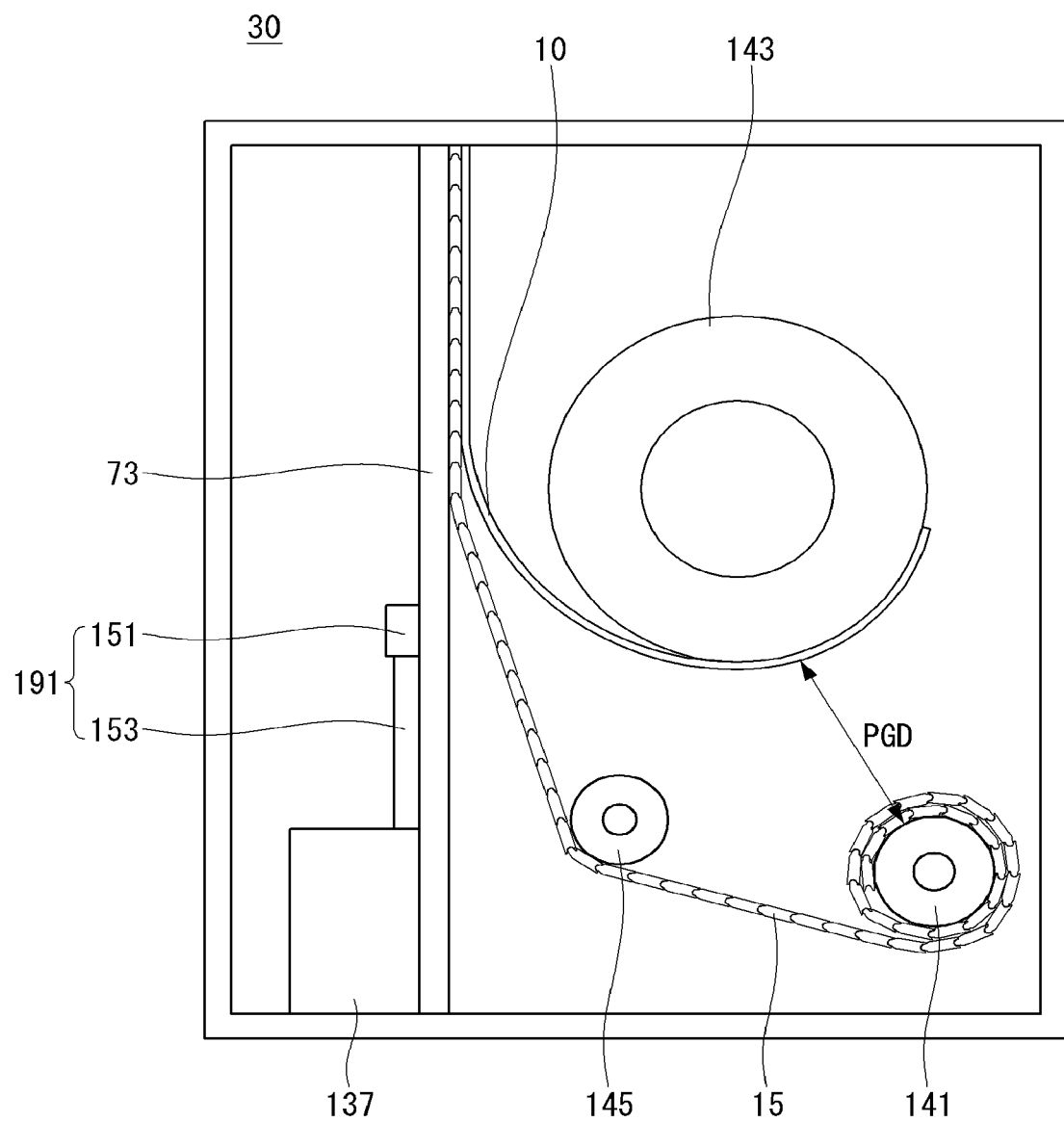
FIGS. 7 to 18 are diagrams illustrating a display device according to an exemplary embodiment of the present invention.

Referring to FIG. 7, a display device according to the present invention may include a housing 30, and the housing may include a panel roller 143, an apron roller 141, a guide roller 145, a motor assembly 137, a support link 73, and an assist link 191.

The panel roller 143 may be disposed in the upper part within the housing 30. The panel roller 143 is able to wind and unwind the display panel 10. The winding and unwinding capability of the panel roller 143 may be greater than adhesive strength of the display panel 10 and the module cover 15.

The apron roller 141 may be disposed below the panel roller 143. The apron roller 141 is able to wind and unwind the module cover 15. Since the module cover 15 is thick, the diameter of the apron roller 141 may become greater when the second state is shifted to the first state. Accordingly, to avoid contacting the panel roller 143, the apron roller 141 may be spaced apart from the panel roller 43 at an interval equal or greater than a first PGD. The first PGD may be a distance at which the apron roller 141 is from the panel roller 143 in the first state, or may be further than such a distance.

The guide roller 145 may be disposed on a line where the apron roller 141 is spread. The guide roller 145 may guide a location of the module cover 15 so as to prevent the module cover 145 from contacting the panel roller 143 when the module cover 15 is in at least one of the first state and the second state. The guide roller 145 may be disposed below the panel roller 143 so as to protect the module cover 15 from contacting the panel roller 143, The support link 73 may support the display panel 10 and the module cover 15 to go upward or downward. Specifically, although not illustrated in the drawings, the support link 73 may help a top bar combined with the top of the module cover 15 and with the top of the display panel 10 so as to cause the top bar to go upward or downward. The driving method of the support link 73 is described in detail in the following.

Since only the top of the module cover 15 and the top of the display panel 10 are connected to the top bar, the rest parts of the module cover 15 and the rest parts of the display panel 10 may be easily bend. Accordingly, the support link 73 may be disposed on the rear surface of the module cover 15 so as to support the module cover 15 not to be bent. Since the support link 73 continuously moves when the first state is shifted to the second state, the support link 73 is not combined with the module cover 15, but is able to support the module cover 15.

In an area where the support link 73 is connected to the housing 30, the motor assembly 137 may be disposed. The motor assembly 137 may drive the support link 73 to go upward or downward. The motor assembly 137 may receive an electric signal and transform the electric signal into physical force. The motor assembly 137 transfers rotational energy to the support link 73 to shift from the first state to the second state. A configuration of the motor assembly 137 and a driving method thereof are described in detail in the following.

The assist link 191 connected to the support link 73 may be disposed on one side of the support link 73. The assist link 191 may help the support link 73 to go upward or downward. The other side of the assist link 191 may be connected to the bottom surface of the housing 30. A configuration of the assist link 191 and a driving method thereof are described in detail in the following. The motor assembly 137, the support link 73, and the assist link 191 may compose a driving unit configured to cause the display unit 20 to go upward.

In the display device according to the present invention, the display panel 10 and the module cover 15 are wound and unwound on one side, while a device configured to cause the display panel 10 and the module cover 15 to go upward or downward may be disposed on the other side. Accordingly, the support link 73 may easily support the display panel 10 and the module cover 15.

Figure 8:
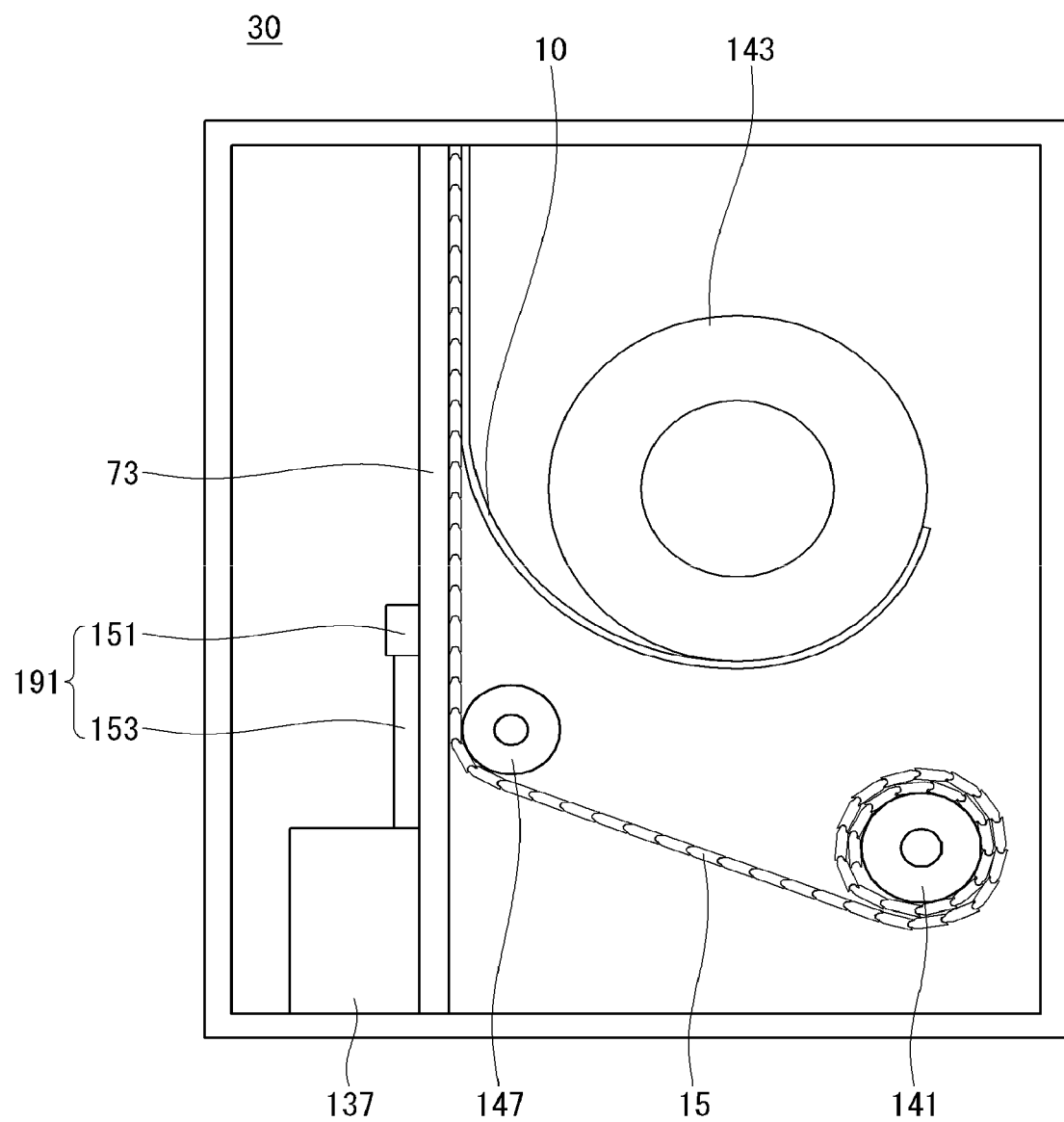

Referring to FIG. 8, in the display device according to the present invention, a pressure roller 147 may be disposed, instead of a guide roller. The pressure roller 147 may pressure the module cover 15 to be in contact with the support link 73. Accordingly, the module cover 15 may not be bent but remain flat. The pressure roller 147 may be disposed close to the support link 73 in the third direction so as to cause the module cover 15 to be in contact with the support link 73. The pressure roller 147 may guide the module cover 15 to prevent the module cover 15 from contacting the panel roller 143.

In the display device according to the present invention, the pressure roller 147 may press the module cover 15 to be in contact with the support link 73. Accordingly, users can immerse themselves in the flat display panel 10.

Figure 9:
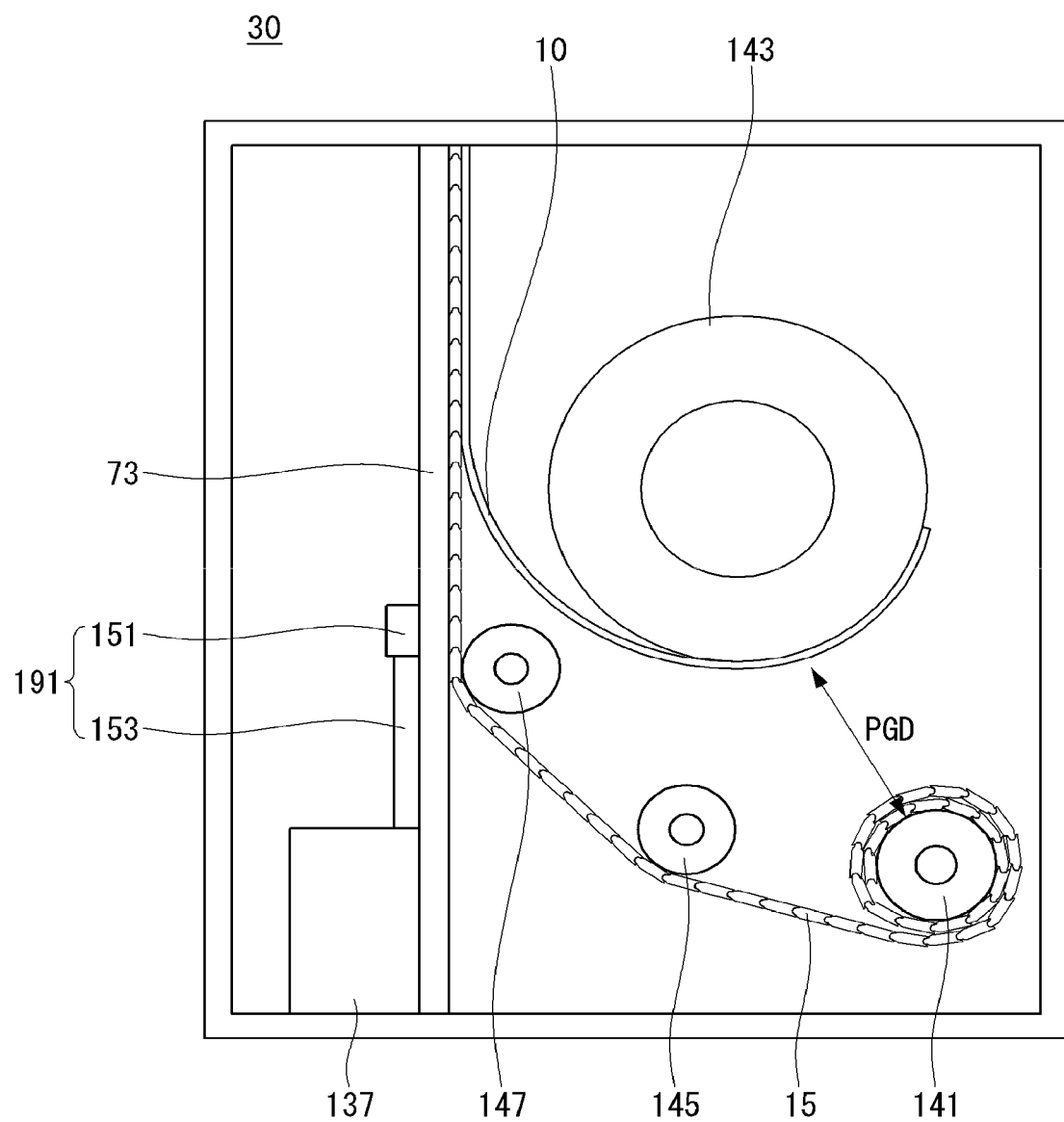

Referring to FIG. 9, in the display device according to the present invention, there may be provided both of the guide roller 145 and the pressure roller 147. Accordingly, the module cover 15 may not be in contact with the panel roller 143, but be in contact with the support link 73. As a result, the display device may malfunction less often and users can enjoy an image on the flat display panel 10.

Figure 10:
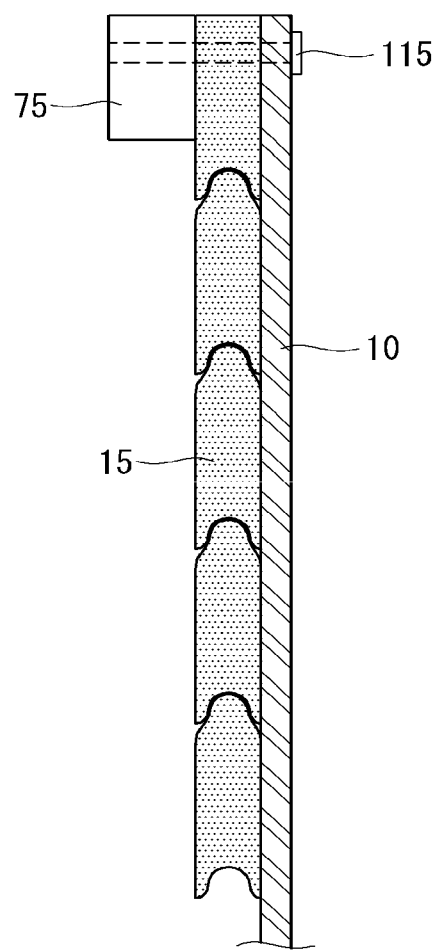

Referring to FIG. 10, the module cover 15 and the display panel 10 may be clamped to the top bar 75 in the display device according to the present invention. Specifically, the module cover 15 and the display panel 10 may be clamped to the top bar 75 by at least one screw 115, At least one screw 115 causes the module cover 15 and the display panel 10 to go upward along with the top bar 75 going upward, while preventing breakaway of the module cover 15 and the display panel 10. At least one screw 115 may penetrate the top bar 75, the module cover 15, and the display panel 10 in order to let the top bar 75, the module cover 15, and the display panel 10 clamped to one another. However, aspects of the present invention are not limited thereto, and at least one screw 115 may penetrate only the module cover 15 and the display panel 10.

In the display device according to the present invention, the top bar 75, the module cover 15, and the display panel 10 may be combined with each other. Accordingly, the module cover 15 and the display panel 10 may go upward easily without breaking away.

Figure 11:
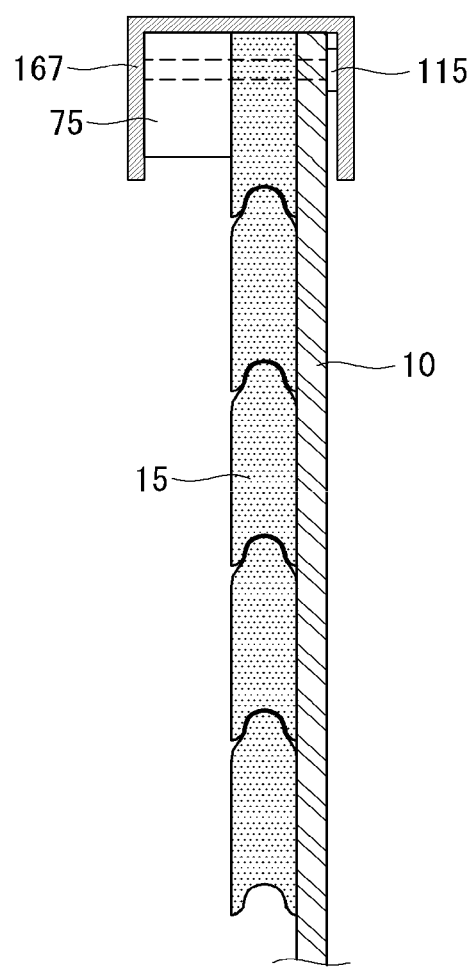

Referring to FIG. 11, in the display device according to the present invention, a top case 167 may cover the top bar 75, the module cover 15, and the display panel 10. The top case 167 may cover the top bar 75, the module cover 15, and the both sides and the top area of the display panel 10. The top case 167, the top bar 75, the module cover 15, and the display panel 10 may be clamped by at least one screw 115. However, aspects of the present invention are not limited thereto, and the top case 167 may be fit into recesses of the top bar 75, the module cover 15, and the display panel 10, respectively.

In the display device according to the present invention, the top case 167 may cover the top bar 75, the module cover 15, and the display panel 10. Accordingly, users may feel that the outer appearance of the display device is neat.

Figure 12:
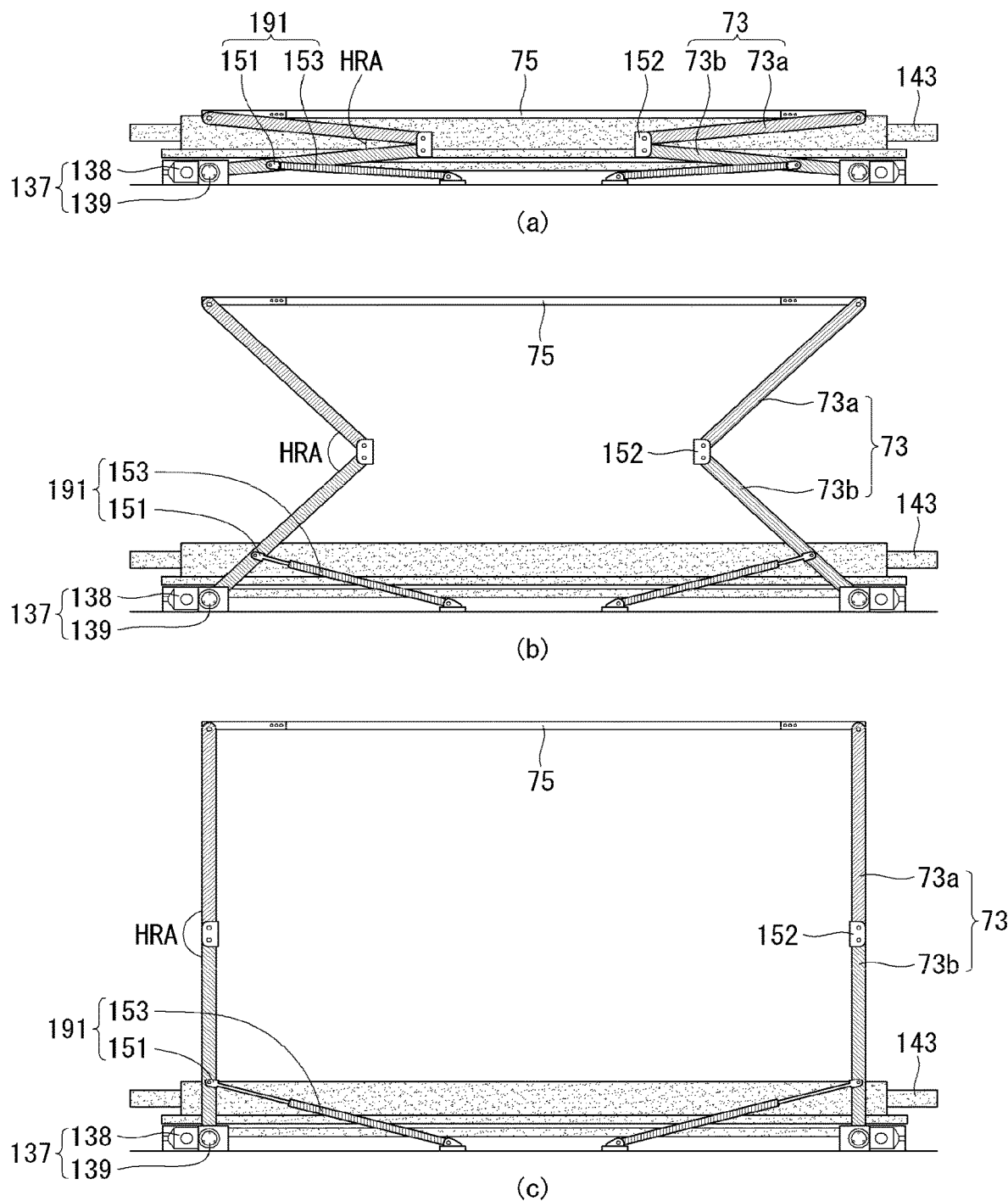

Referring to FIG. 12, in the display device according to the present invention, the top bar 75 may go upward as the first state is shifted to the second state. The support link 73 may be connected to the both ends of the top bar 75. The top bar 75 may go upward or downward due to the pushing force of the support link 73.

One end of the support link 73 may be connected to the top bar 75, and the other end thereof may be connected to the motor assembly 137. The support link 73 may include an upper support link 73a, the lower support link 73b, and a connector 152.

One end of the upper support link 73a may be connected to the top bar 73, and the other end thereof may be combined with the connector 152. One end of the lower support link 73b may be combined with the connector 152 and the other end thereof may be connected to the motor assembly 137.

As shown in (a) of FIG. 1, an angle HLA between the upper support link 73a and the lower support link 73b may be small in the first state. Accordingly, the top bar 75 may not go upward. In addition, the panel roller 143 may be rolled.

As shown in (b) of FIG. 12, as the motor assembly 137 rotates, the angle HLA between the upper support link 73a and the lower support link 73b may become greater. As the angle HLA between the upper support link 73a and the lower support link 73b becomes greater, the top bar 75 may go upward. In addition, as the top bar 75 goes upward, the wound panel roller 143 may starts to unroll.

As shown in (c) of FIG. 12, the upper support link 73a and the lower support link 73b may be disposed in a straight line in the second state. That is, the angle HLA between the upper support link 73b and the lower support link 73b may be 180°. In the second state, the top bar 75 goes upward, thereby leading the panel roller 143 to unroll.

Figure 13:
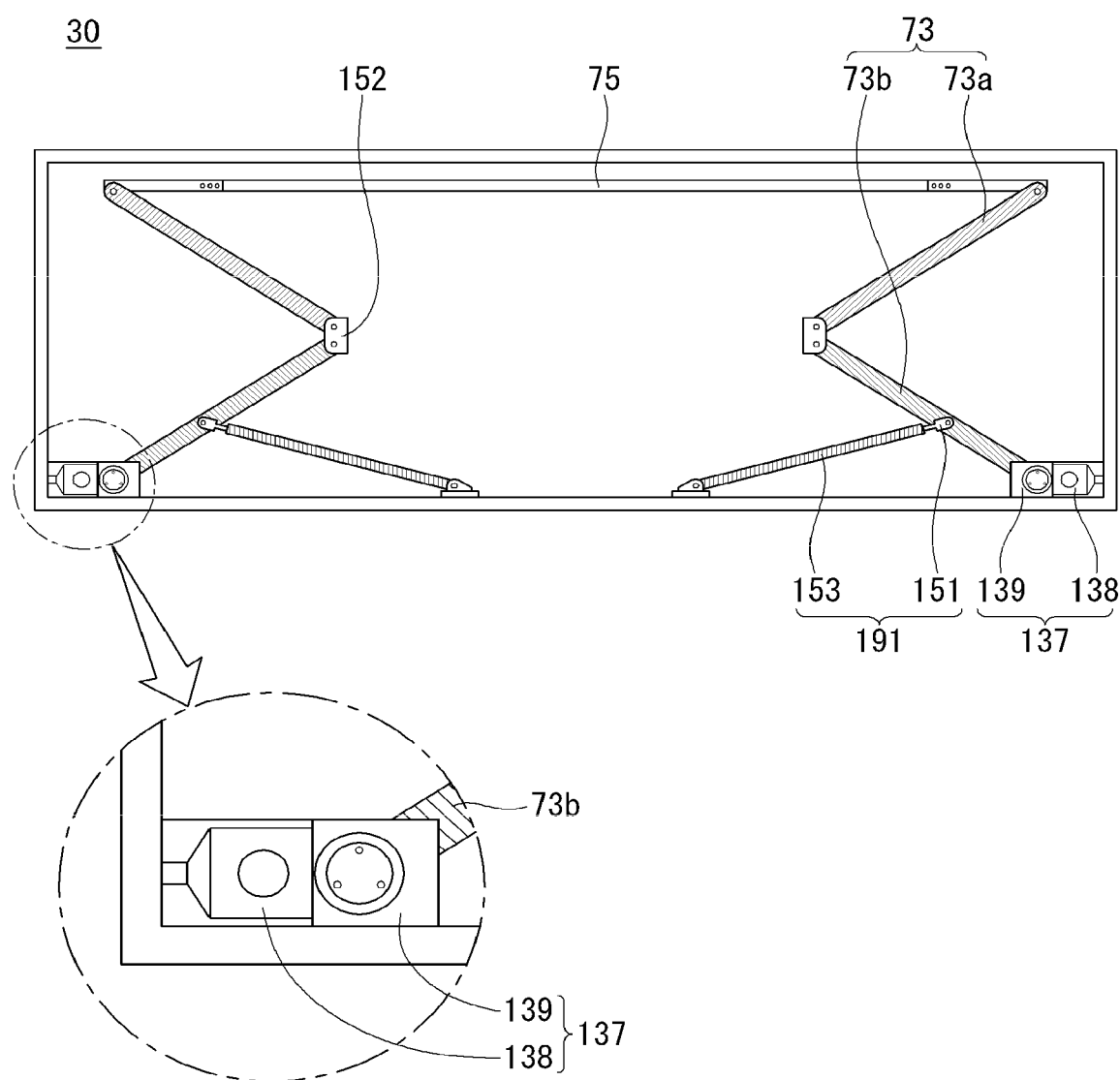

Referring to FIG. 13, the motor assembly 137 may include a motor 138 and a decelerator 139.

The motor 138 may receive an electric signal and transform the electric signal into physical force. The motor 138 may transfer rotational energy to the decelerator 139. The motor 138 may be fixed on both sides of the bottom surface of the housing 30.

The decelerator 139 may be engaged with the motor 138. The decelerator 139 may be covered by a cover which is different from a cover for the motor 138. The decelerator 139 and the motor 138 are covered by different covers so that unnecessary interruption therebetween may be avoided. However, aspects of the present invention are not limited thereto, and the decelerator 139 and the motor 138 may be covered by the same cover.

The decelerator 139 may rotate in the first direction if the motor 130 rotates in the first direction, while the decelerator 139 may rotate in the second direction if the motor 130 rotates in the second direction. The decelerator 139 may reduce rotational speed transferred from the motor 130, but transfer increased rotational energy.

If the decelerator 139 rotates in the first direction, an angle of the lower support link 73b connected to the decelerator 139 with respect to the ground may become greater. Alternatively, if the decelerator 139 rotates in the second direction which is opposite to the first direction, the angle of the lower support link 73b with respect to the ground may become smaller.

Figure 14:
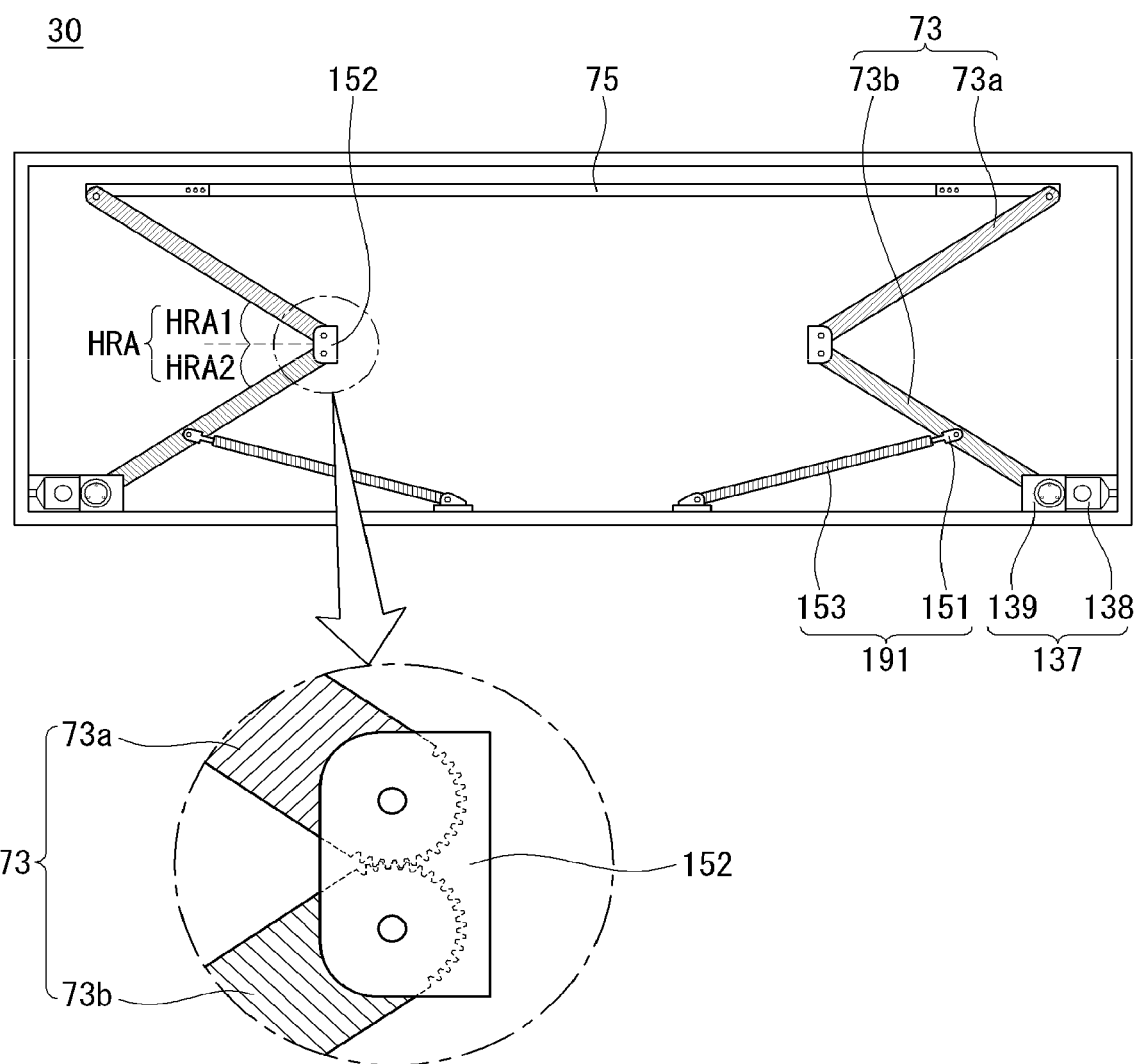

Referring to FIG. 14, in the display device according to the present invention, the other side of the upper support link 73 and one side of the lower support link 73b within the connector 152 may be in the shape of gears engaged with each other. The connector 152 may fix the upper support link 73a and the lower support link 73b so that end gears of the upper support link 73a and the lower support link 73b, which are facing each other, may be engaged with each other.

An angle HRA1 of the upper support link 73a with respect to the ground and an angle HRA2 of the lower support link 73b with respect to the ground may be identical since the upper support link 73a and the lower support link 73b are the shape of gears engaged with each other. In addition, an angle between the upper support link 73a and the lower support link 73b on one side may be identical to an angle therebetween on the other side since the upper support link 73a and the lower support link 73b are in the shape of gears engaged with each other. Accordingly, the both sides of the top bar 75 may go upward or downward equally without being twisted. That is, regardless of a state of the display panel, the angle between the upper support link 73a and the lower support link 73b on one side is identical to the angle therebetween on the other side.

In the display device according to the present invention, the both sides of the top bar 75 may be maintained at the same height. Accordingly, users may immerse themselves in a screen which is not tilted.

Figure 15:
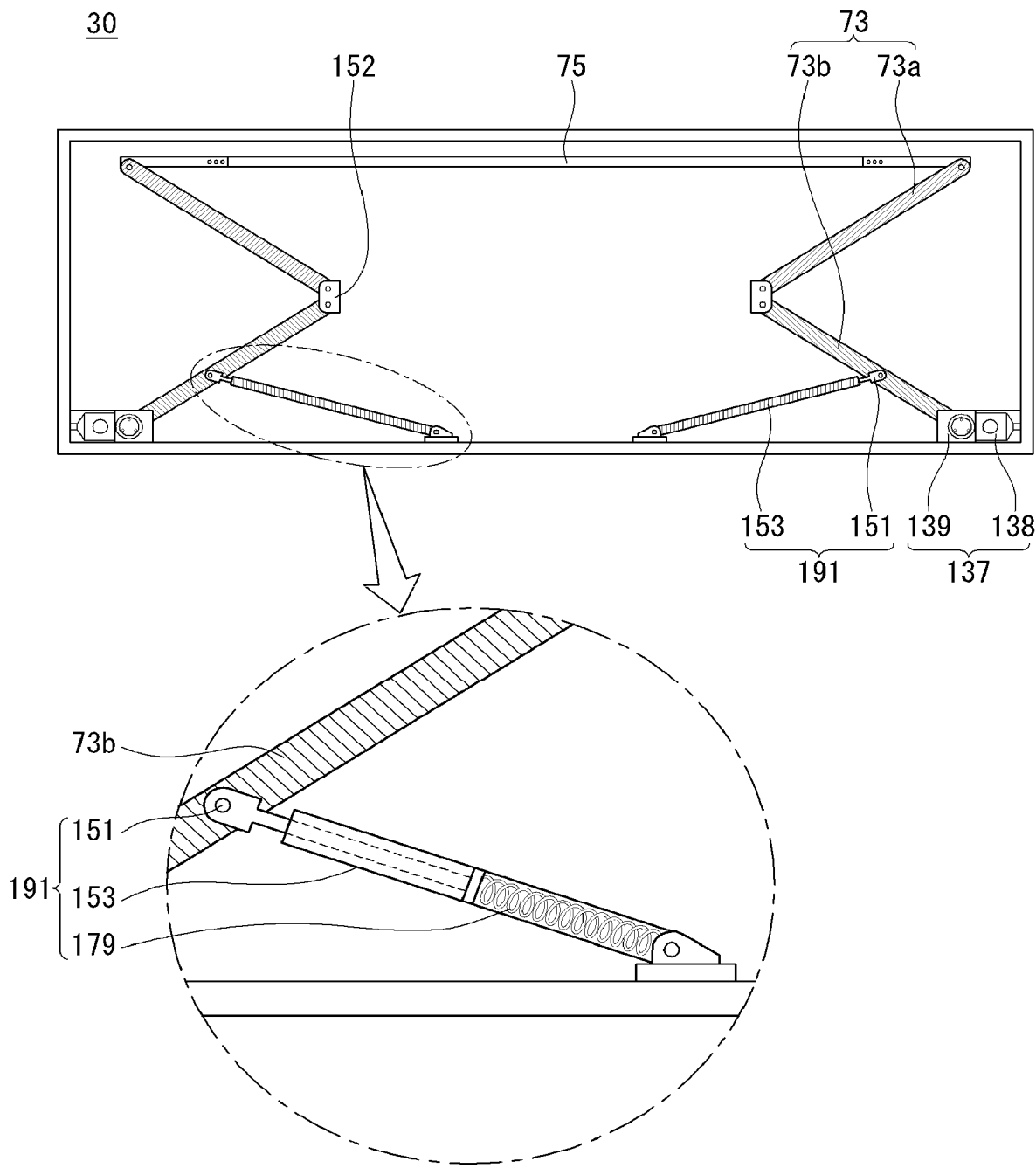

Referring to FIG. 15, in the display device according to the present invention, the assist link 191 may push the lower support link 73b. The assist link 191 may include a joint part 151, a column member 153, and a spring member 179.

The joint part 151 may be a portion that combines the assist link 191 and the lower support link 73b. Specifically, the joint part 151 may be combined with a portion which is close to the motor assembly 137 of the lower support link 73b.

The spring member 179 may press the joint part 151 below the joint part 151. The spring member 179 may be compressed when the lower support link 73b goes downward, and may expand when the lower support link 73b goes upward. Accordingly, when the lower support link 73b goes upward, the spring member 179 may add force to the lower support link 73b by using elastic force.

The column member 153 may cover at least some portion of the joint par 151 and the spring member 179. Accordingly, when expanding due to electric force, the spring member 179 may add force to the lower support link 73b without breaking away.

In the display device according to the present invention, the assist link 191 may press the lower support link 73b due to electric force. Accordingly, the top bar 75 may be enabled to go upward more easily.

Figure 16:
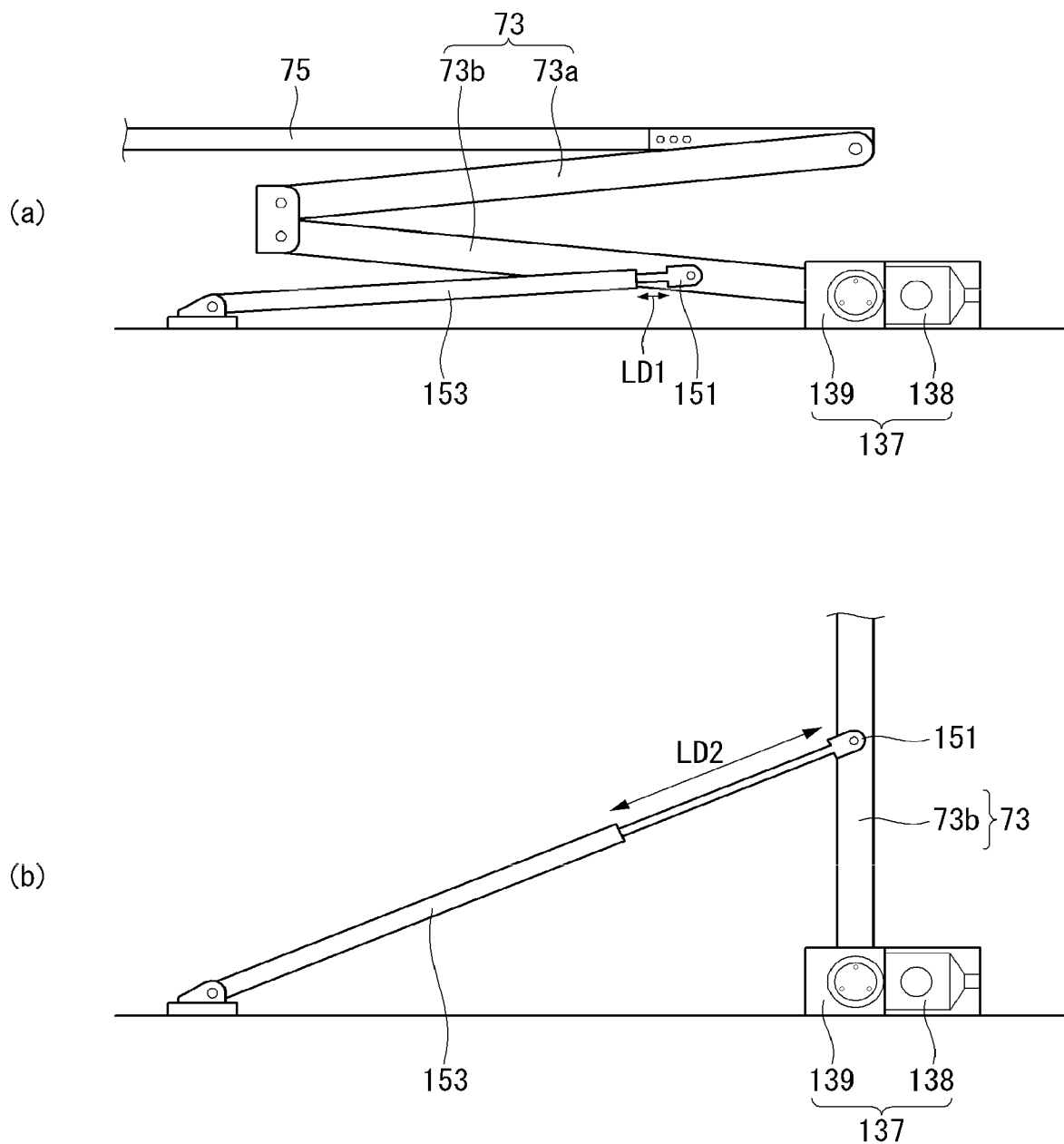

Referring to FIG. 16, in the first state, the joint part 151 may be exposed as much as a first distance LD1 from the column member 153. By contrast, in the case of the second state, the joint part 151 may be exposed as much as a second distance LD2 from the column member 153. For example, the first distance LD1 may be shorter than the second distance LD2. As the first distance LD1 is extended to the second distance LD2, the joint part 151 may be enabled to push the lower support link 73b. The joint part 151 may put pressure in a direction in which the angle between the lower support link 73b and the upper support link 73a becomes greater.

In the display device according to the present invention, an exposed length of the joint part 151 may be extended when the first state is shifted to the second state. Accordingly, the lower support link 73b is pressed to thereby go upward.

Figure 17:
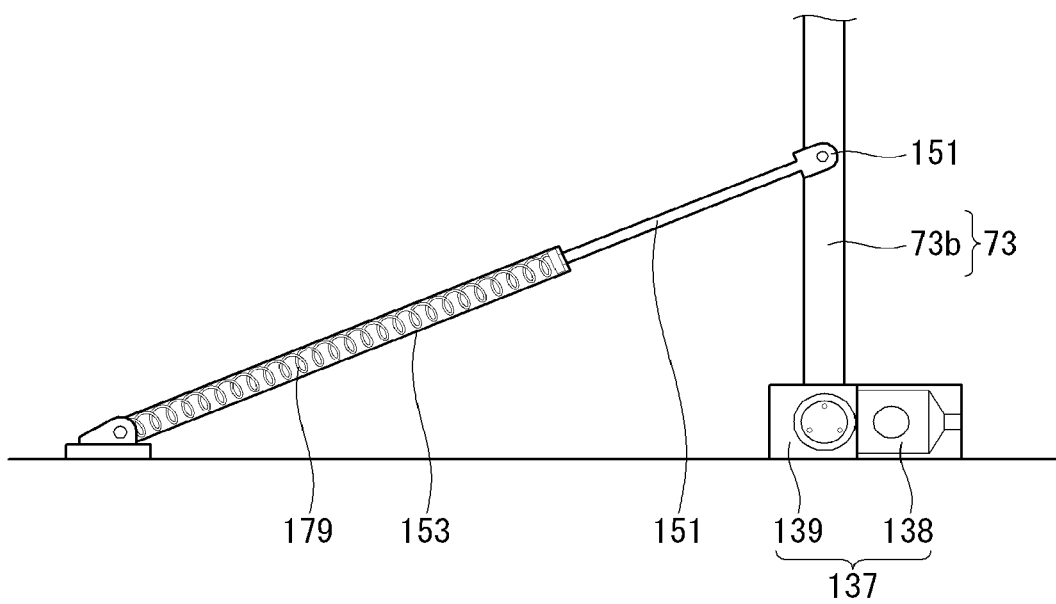

Referring to FIG. 17, in the display device according to the present invention, the spring member 179 may not be exposed from the column member 153 in the second state. That is, the spring member 179 is not exposed from the column member 153 in any state. Since the spring member 179 is not exposed from the column member 153, the spring member 179 may be enabled to press the lower support link 73b without breaking away.

In the display device according to the present invention, the spring member 179 may not be exposed from the column member 153. Accordingly, the display device may have a neat outer appearance and electric force may not be distributed.

Figure 18:
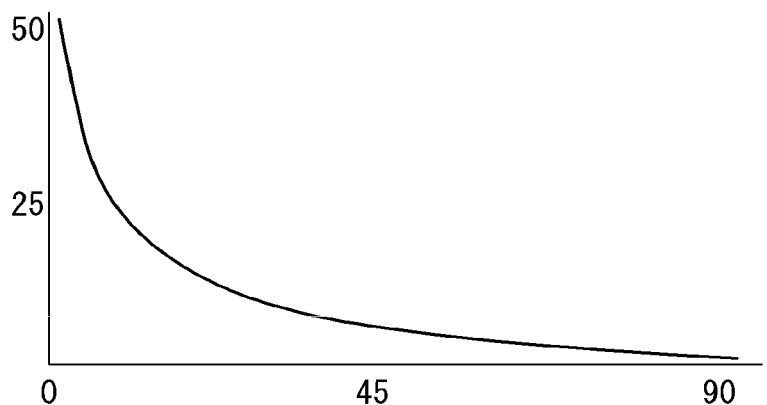
Figure 18:
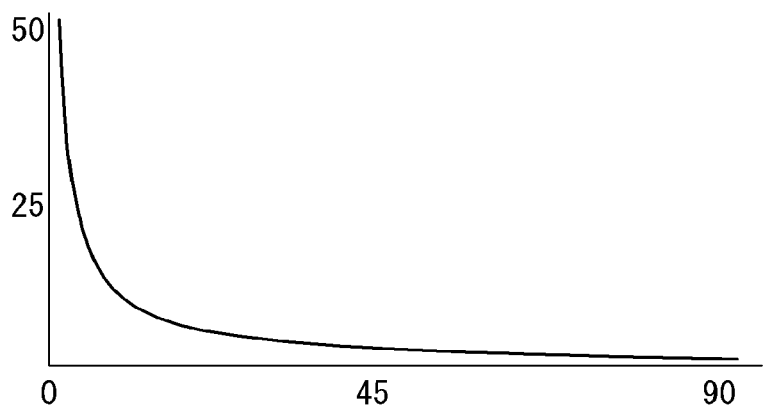

Referring to FIG. 18, (a) of FIG. 18 is a graph showing a relationship between an angle of a lower support link with respect to the ground and torque of a motor before an assist link is used, and (b) of FIG. 18 is a graph showing a relationship between the angle of the lower support link with respect to the ground and torque of the motor when the assist link is used.

As shown in the graphs, the closer the angle of the lower support link with respect to the ground is to 0, the greater the torque becomes. That is, the torque is significant when the first state starts to being shifted.

By comparing the two graphs, it is found that, before the assist link is used, torque is reduced gradually if the angle becomes greater. However, once the assist link is used, torque is reduced dramatically if the angle becomes greater. That is, when the first state starts to being shifted, the lower support link may greatly help the assist link to reduce torque.

By using the assist link, the display device according to the present invention may significantly reduce torque required to cause the lower support link to go upward. Accordingly, it is possible to cause a display unit to go upward or downward more easily and more smoothly.

FIGS. 19 to 41 are diagrams illustrating a display device according to another exemplary embodiment of the present invention.

Figure 19:
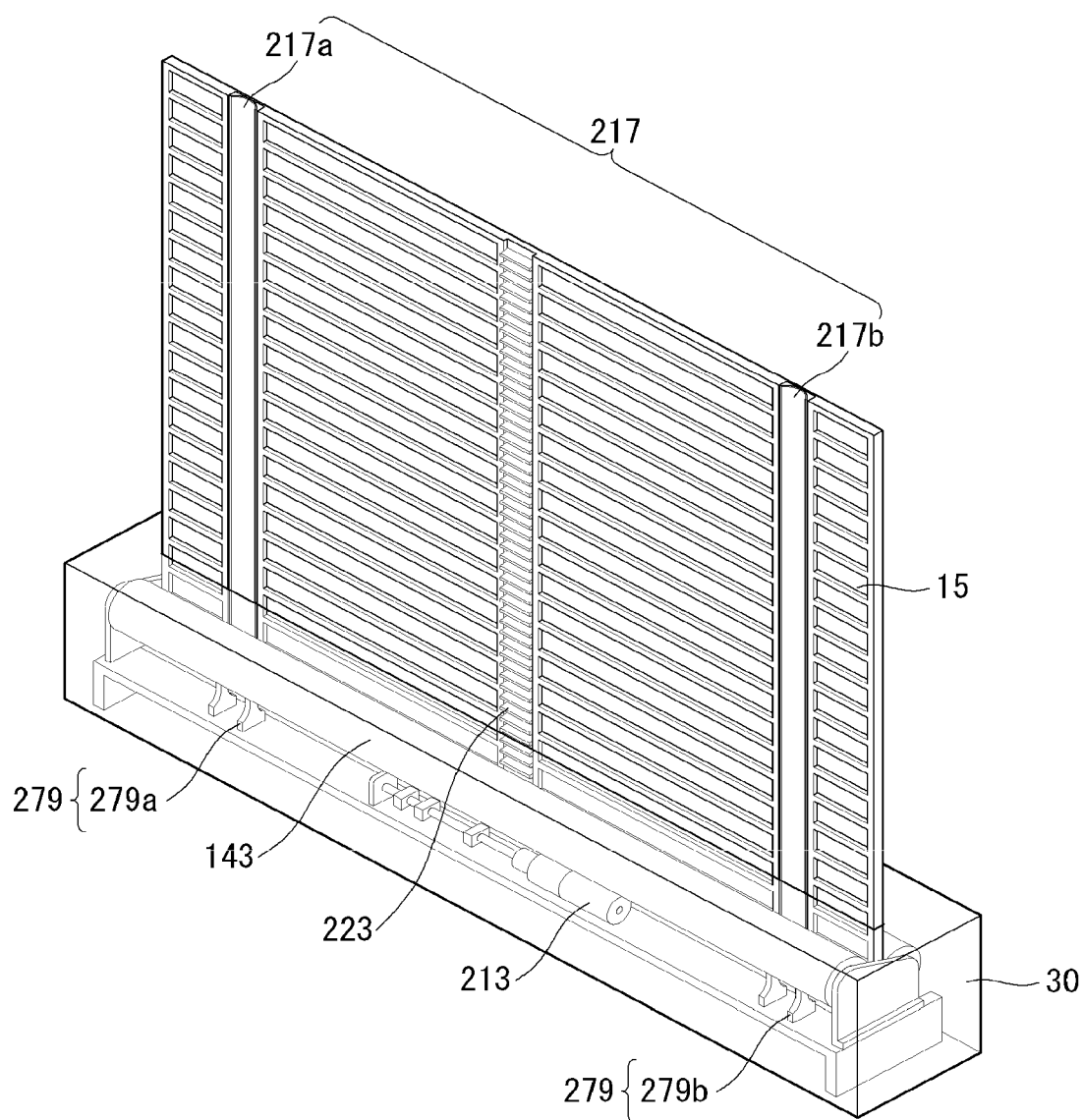
FIGS. 19 to 41 are diagrams illustrating a display device according to another exemplary embodiment of the present invention.

Referring to FIG. 19, in a display device 100 according to the present invention, elastic pieces 217 may be disposed on both sides of the module cover 15. The elastic pieces 217 may hold the module cover 15 on the both sides to prevent the module cover 15 from being bent. A configuration of each elastic piece 217 is described in detail in the following.

As the elastic pieces 217 are disposed on the module cover 15, the module cover 15 may not be bent although the upper part thereof is not held. Accordingly, any other structure required to hold the module cover 15 is not necessary so that a space may be saved.

Insertion guides 279 may be disposed on both sides within the housing 30 to allow the elastic pieces 217 to be inserted into a groove of the module cover 15. The insertion guides 279 may guide the elastic pieces 217 to be easily inserted into the groove of the module cover 15. How the insertion guides 279 guide the elastic pieces 217 to be inserted into the groove of the module cover 15 is described in detail in the following.

A driving unit 213 enabled to cause the module cover 15 to go upward may be disposed in the center of the housing 15. Since the elastic pieces 217 exist, the driving unit 213 may not need a structure for supporting the module cover 15. Accordingly, by using a simpler configuration, it is possible to cause the module cover 15 to go upward.

In the display device 100 according to the present invention, the elastic pieces 217 may be disposed on both sides of the module cover 15. Accordingly, it is possible to cause the module cover 15 to go upward, without additionally supporting the module cover 15.

Figure 20:
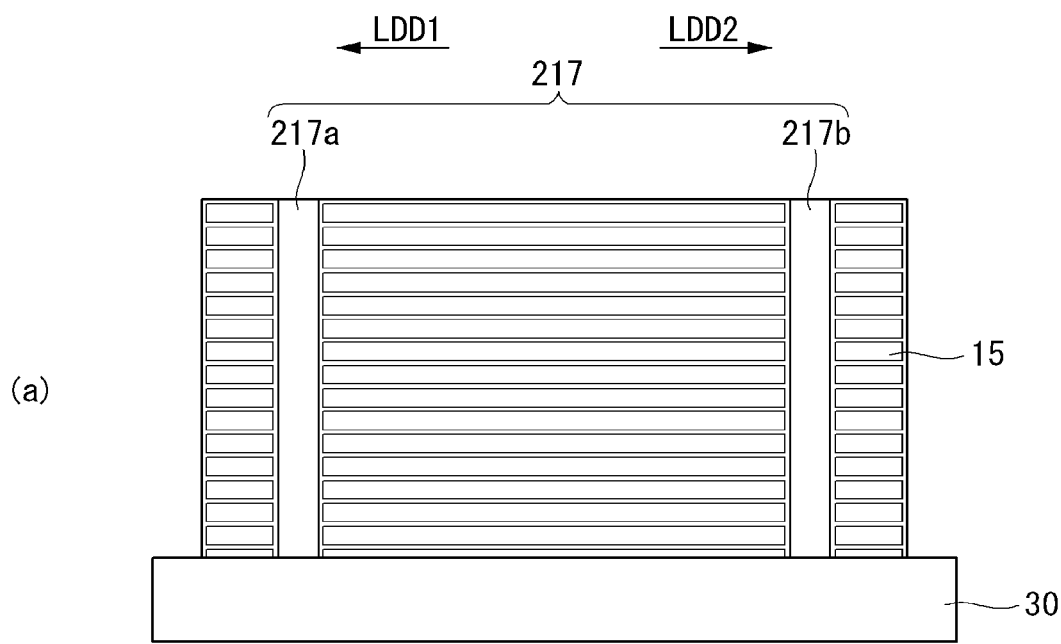
Figure 20:
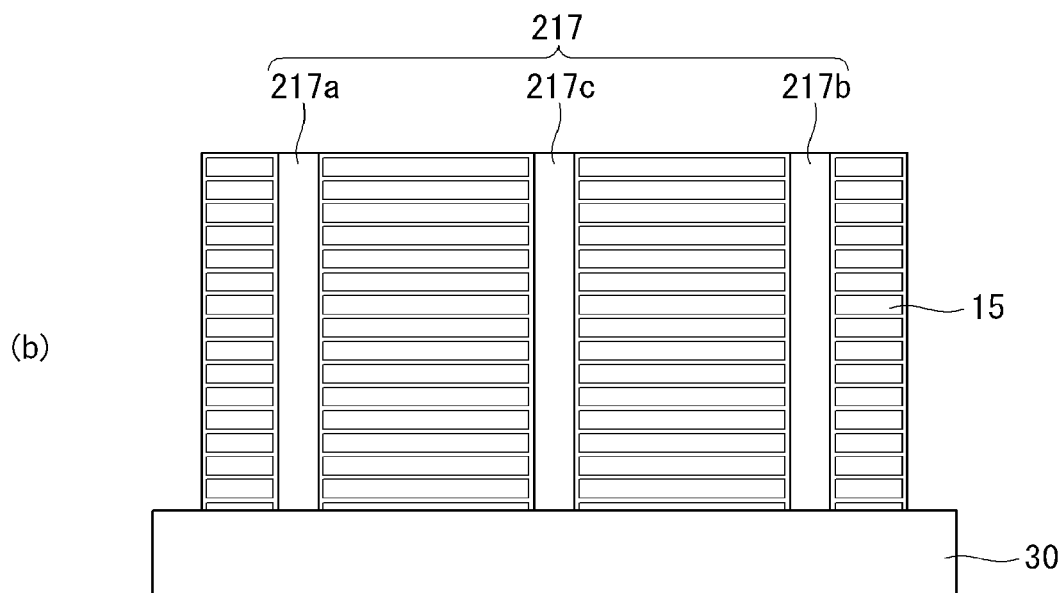

Referring to FIG. 20, in the display device 100 according to the present invention, a plurality of elastic pieces 217 may be spaced apart from each other on the module cover 15. The elastic pieces 217 may be extended in the major axis direction of the display device 100.

As shown in (a) of FIG. 20, the elastic pieces 217 may include the first elastic piece 217a and the second elastic piece 217b which are at an equal distance from the center of the module cover 15 in the first major axis direction LDD1 and the second major axis direction LDD2, respectively, wherein the first major axis direction LDD1 and the second major axis direction LDD2 are opposite to each other. Since the first elastic piece 217a and the second elastic piece 217b are at an equal distance from the center of the module cover 15, the module cover 15 may be flat without being bent in any direction.

As shown in (b) of FIG. 20, the elastic pieces 217 may further include a third elastic piece 217c disposed along the center of the module cover 15, in addition to the first and second elastic pieces 217a and 217b. Since the elastic pieces 217 are disposed not only on both sides of the module cover 15, but also on the center thereof, the elastic pieces 217 may more greatly support the module cover 15 not to be bent, compared to the case where there are only the first and second elastic pieces 217a and 217b.

In the display device 100 according to the present invention, a plurality of elastic pieces 217 may be disposed at the same location by reference to the center of the module cover 15. Accordingly, the module cover 15 may be maintained to be flat.

Figure 21:
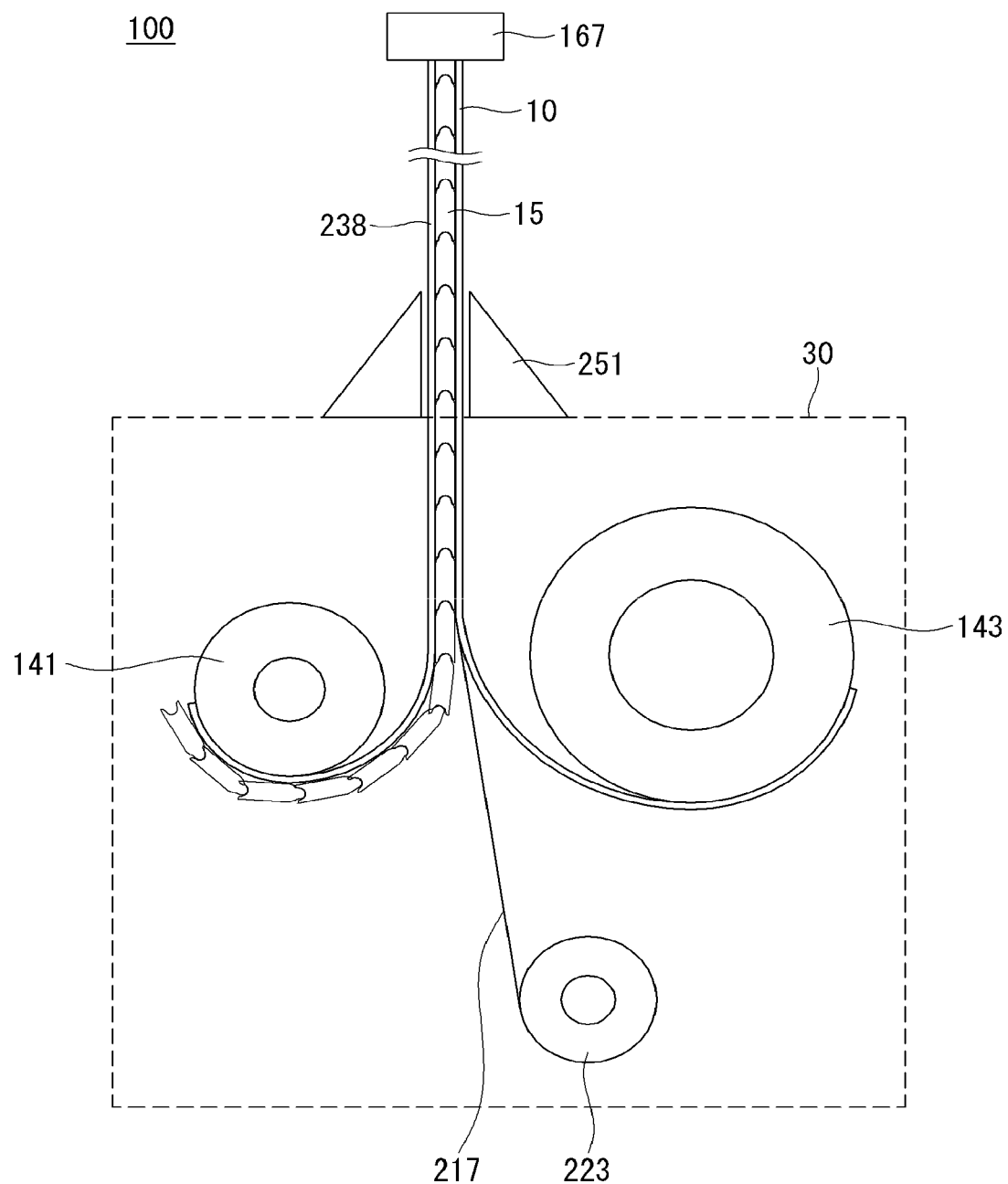

Referring to FIG. 21, in the display device 100 according to the present invention, a panel roller 143 and an apron roller 141 may be disposed opposite by reference to the center of the housing 30. Since the elastic pieces 217 exist, an additional structure for supporting the module cover 15 and the display panel 10 may not be needed. Accordingly, it is possible to secure a space where the panel roller 143 and the apron roller 141 can be disposed opposite. In addition, since the panel roller 143 and the apron roller 141 are disposed opposite and thus not contact each other, malfunction may be avoided.

A sheet 238 may be disposed on the rear surface of the module cover 15. Along with an apron, the sheet 238 may be wound and unwound around the apron roller 141. The sheet 238 is thinner than the module cover 15, and thus, it can be wound and unwound more easily around the apron roller 141. The sheet 238 and the module cover 15 may be attached each other using a double-sided tape. The sheet 238 may include a fabric material.

A top case 167 may cover the top of the module cover 15 and the top of the display panel. Due to the top case 167, users may feel that the outer appearance of the top of the display panel 10 is neat.

Below the panel roller 143, there may be an elastic piece roller 223 that helps prevent the module cover 15 from being bent. The elastic piece roller 223 may wind and unwind an elastic piece 217. Since the elastic piece 217 has to be inserted into a groove of the module cover 15, the elastic piece roller 223 may be disposed between the module cover 15 and the display panel 10.

A stand guide 251 may be disposed in an area where the module cover 15 and the display panel 10 go upward from the housing 30. The stand guide 251 may be in the shape of a triangular prism being in the decubitus position. When the module cover 15 and the display panel 10 go upward, the stand guide 251 may help the module cover 15 and the display panel 10 to maintain a vertical state. The stand guide 251 may assist the elastic piece 217 to prevent the module cover 15 from being bent.

By using the elastic piece 217, the display device 100 according to the present invention may wind and unwind the module cover 15 and the display panel 10 without an additional supporting structure. Accordingly, it is possible to utilize the inner space of the housing 30.

Figure 22:
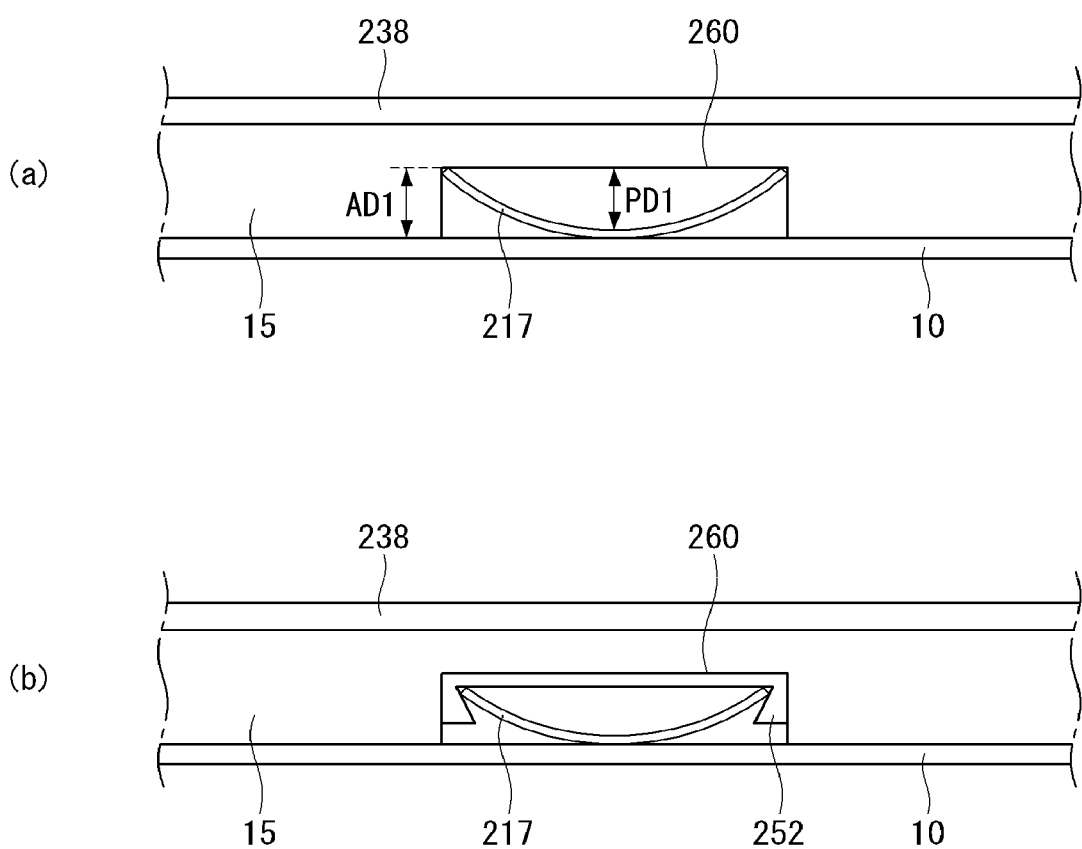

Referring to FIG. 22, in the display device 100 according to the present invention, the elastic piece 217 may be inserted into a groove 260 of the module cover 15. The groove 260 may be sunk to a first width AD1 in a thickness direction of the module cover 15.

The elastic piece 217 may be bent in the thickness direction of the module cover 15. Being bent in the thickness direction of the module cover 15, the elastic piece 217 may be inserted into the groove 260. A first distance PD1 which is a distance from the groove 260 and the central portion of the elastic piece 217 may be shorter than the first width AD1. Accordingly, the elastic piece 217 may not be projected outwardly from the module cover. If the elastic piece 217 is not projected outwardly from the module cover 15, the display panel 10 may remain flat.

An assist clip 252 may be disposed on the bottom surface of the groove 260. The assist clip 252 may help the elastic piece 217 to be fixed into the groove 260. Both ends of the assist clip 252 become projected further in the thickness direction of the module cover 15, and the projected portions may become thicker in the thickness direction of the module cover 15. Accordingly, the assist clip 252 may not break away outwardly from the module cover 15.

In the display device according to the present invention, the elastic piece 217 may be disposed in the groove 260 of the module cover 15. Accordingly, the elastic piece 217 is not exposed outwardly from the module cover 15, so that users may watch an image on a flat display panel.

Figure 23:
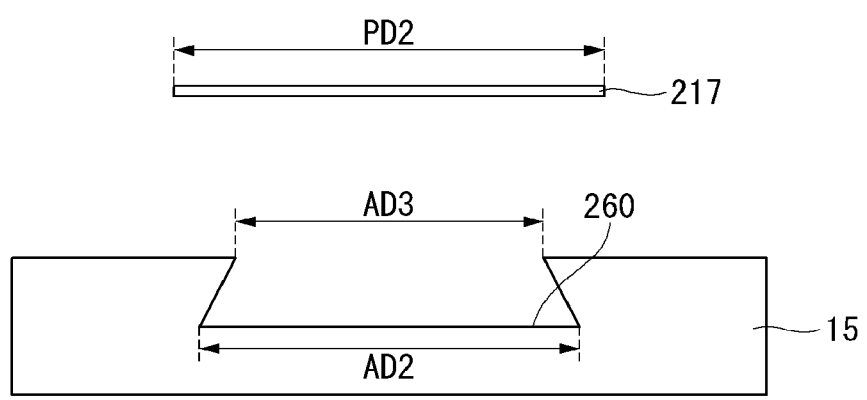

Referring to FIG. 23, in the display device according to the present invention, a second width AD2, which is a thickness of the bottom surface of the groove 260 in the longitudinal direction of the module cover 15, and a third width AD3, which is a width of an opening portion of the groove 260 in the longitudinal direction of the module cover 15, may be shorter than a second distance PD2 which is a length of the major axis direction of the elastic piece 217. Accordingly, the elastic piece 217 may be bent, not flat, to be inserted into the groove 260.

The second width AD2 of the groove 260 may be greater than the third width AD3. Accordingly, both sides of the groove 260 may be projected. Since the both sides of the groove 260 are projected, the elastic piece 217 may be bent within the groove 260 to thereby be easily fixed into the groove 260.

In the display device according to the present invention, both sides of the groove 260 are projected so that the elastic piece 217 may be easily fixed into the groove 260. Accordingly, the module cover 15 may not be bent easily but remain flat.

Figure 24:
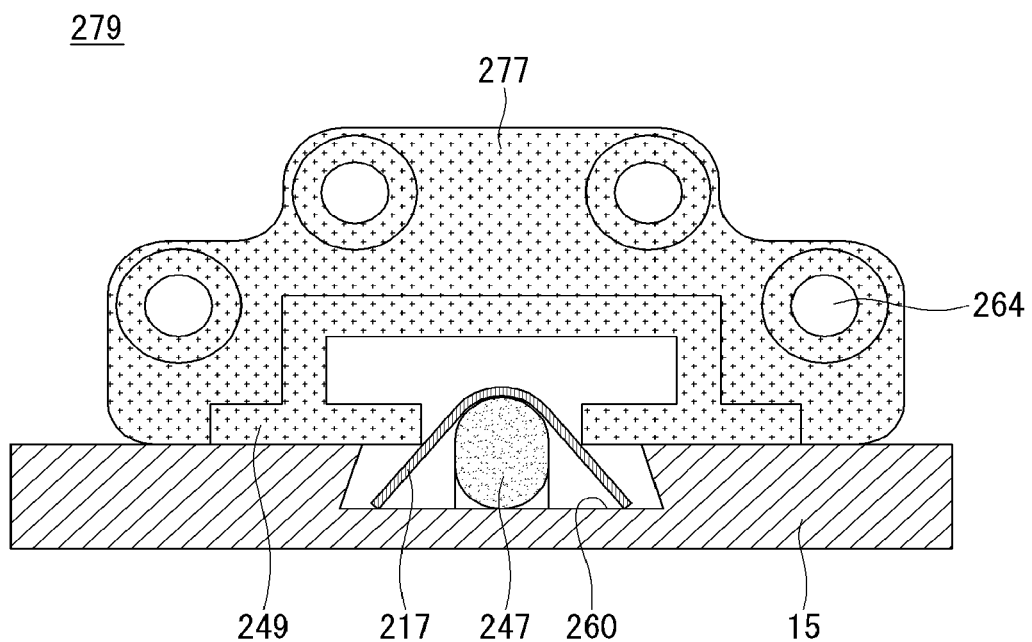

Referring to FIG. 24, the display device according to the present invention may include an insertion guide 279 necessary for inserting the elastic piece 217 into the groove 260 of the module cover 15. The insertion guide 279 may include a jig 277, a pin member 249, and a fixing member 247.

The jig 277 may compose the body of the insertion guide 279. The jig 277 may have a center having an empty space to allow the elastic piece 217 to be inserted into the center thereof. The jig 277 may include at least one fixing hole 264 for fixing the insertion guide 279 into the housing. The jig 277 may be symmetric by reference to the groove 260 of the module cover in the major axis direction of the module cover 15. Accordingly the elastic piece 217 may be guided to be inserted into the groove 260 in a symmetric manner.

The pink member 249 may be projected from the body of the jig 277 toward the center of the groove 260. The pin member 249 may be projected on one side and on the other side of the groove 260 toward the center of the groove 260.

That is, the pin member 249 may be projected toward the center of the groove 260 on the both sides. The pin member 249 may press both ends of the elastic piece 217 against the bottom surface of the groove 260.

The fixing member 247 may be spaced apart from the jig 277. The fixing member 247 may be spaced apart from the pin member 249 to push the center of the elastic piece 217 from the groove 260.

When the elastic piece 247 penetrates the insertion guide 279, the center of the elastic piece 217 may be pushed out from the groove 260 and both ends of the elastic piece 217 may be pressed against the bottom surface of the groove 260. Accordingly, the elastic piece 217 may be bent in the thickness direction of the module cover 15.

In the display device according to the present invention, the insertion guide 279 may guide the elastic piece 217 to be inserted into the groove 260 of the module cover 15. Accordingly, the elastic piece 217 may be bent to be inserted into the groove 260, so that the module cover 15 may not be bent easily.

Figure 25:
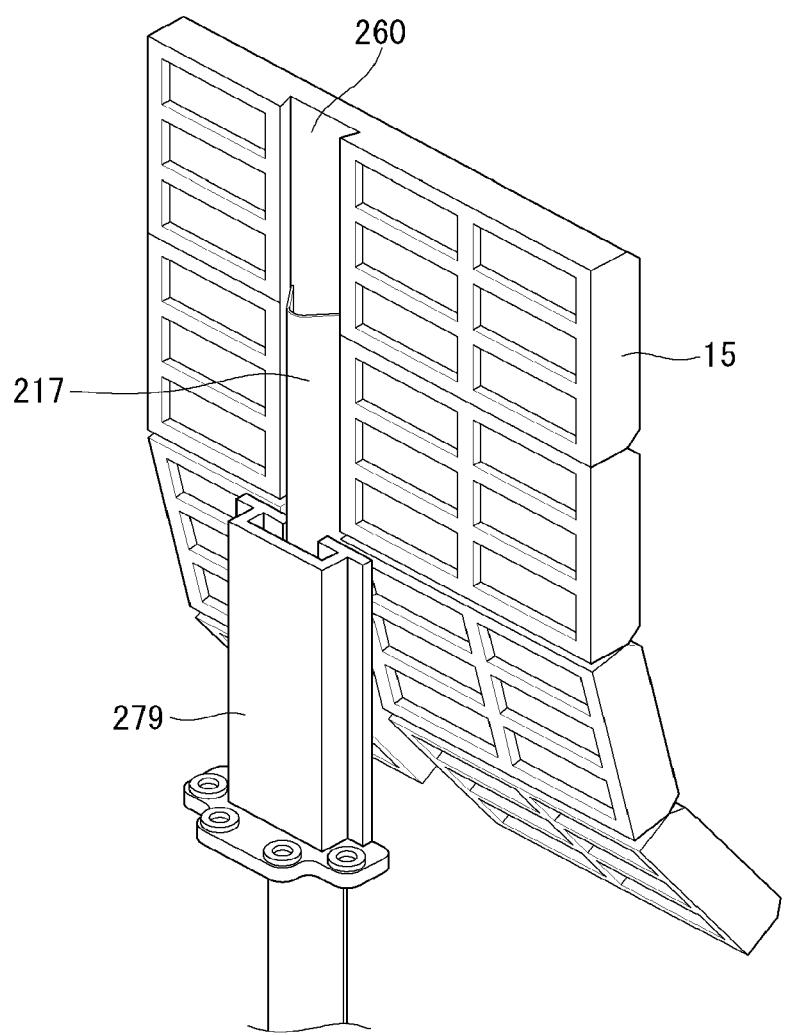

Referring to FIG. 25, in the display device according to the present invention, the insertion guide 279 may be disposed in an area where the module cover 15 starts to meet the elastic piece 217. The insertion guide 279 may guide the elastic piece 217 to be inserted in a bent state into the groove 260. If the elastic piece 217 in a bent state is inserted into the module cover 15, the module cover 15 may be able to stand without any additional supporting means.

In addition, since the elastic piece 217 is inserted into the module cover 15, the module cover 15 may not be partially bent. Accordingly, the module cover 15 may not be cracked.

Figure 26:
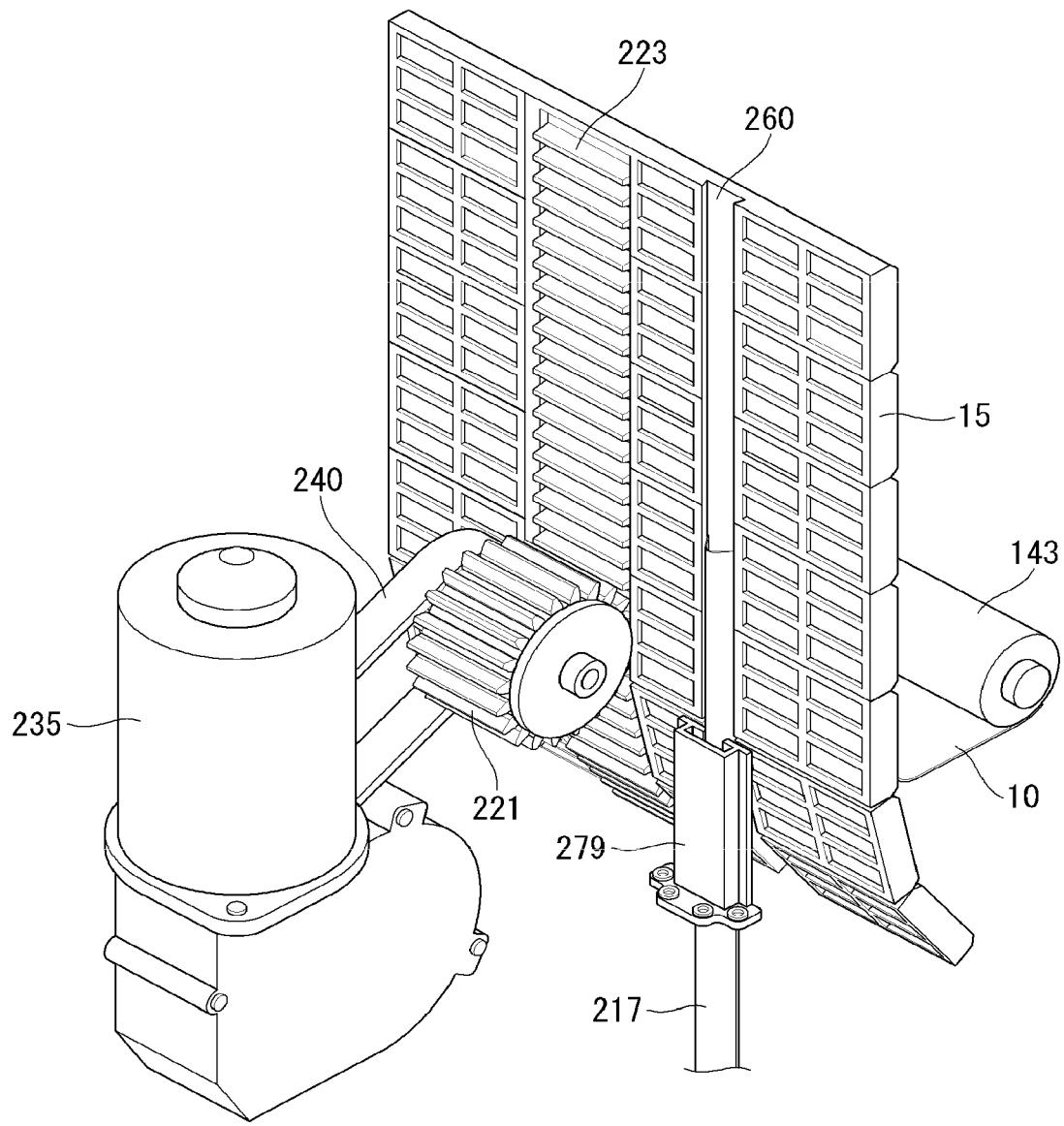

Referring to FIG. 26, in the display device according to the present invention, the driving unit 213 may include a motor 235, a pinion gear 221, and a rack gear 223.

The motor 235 may receive an electric signal and transform the electric signal into physical force. The motor 235 may be fixed within the housing 30.

The pinion gear 221 may be connected to the motor 235. Specifically, the pinion gear 221 may be connected to the motor 235 through a chain 240. The chain 240 may transfer rotational motions of a motor 240 to the pinion gear 221. The pinion gear 221 may increase the rotational energy while reducing rotational speed transferred by a motor 240.

The pinion gear 221 may have a circumference in a toothed shape. If the motor 251 rotates in the first direction, the pinion gear 221 may rotate in the first direction. In addition, if the motor 251 rotates in the second direction, the pinion gear 221 may rotate in the second direction.

The rack gear 223 may be disposed on the module cover 15. The rack gear 223 may be a concave-convex pattern on the module cover 15. The rack gear 223 may be disposed on the module cover 15 in a manner of being extended in the minor axis direction. The specific location of the rack rear 223 is described in the following.

The rack rear 223 may transform rotational motions transferred by the pinion gear 221 into horizontal motions. The rotation motions may be transferred as the teeth of the pinion gear 221 are engaged with the concave-convex pattern of the rack gear 223.

Due to the pinion gear 221 and the rack gear 223, the display device according to the present invention is able to cause the module cover 15 to go upward. As the teeth are engaged with each other in more fitted manner, the module cover 15 may go upward with greater force.

Figure 27:
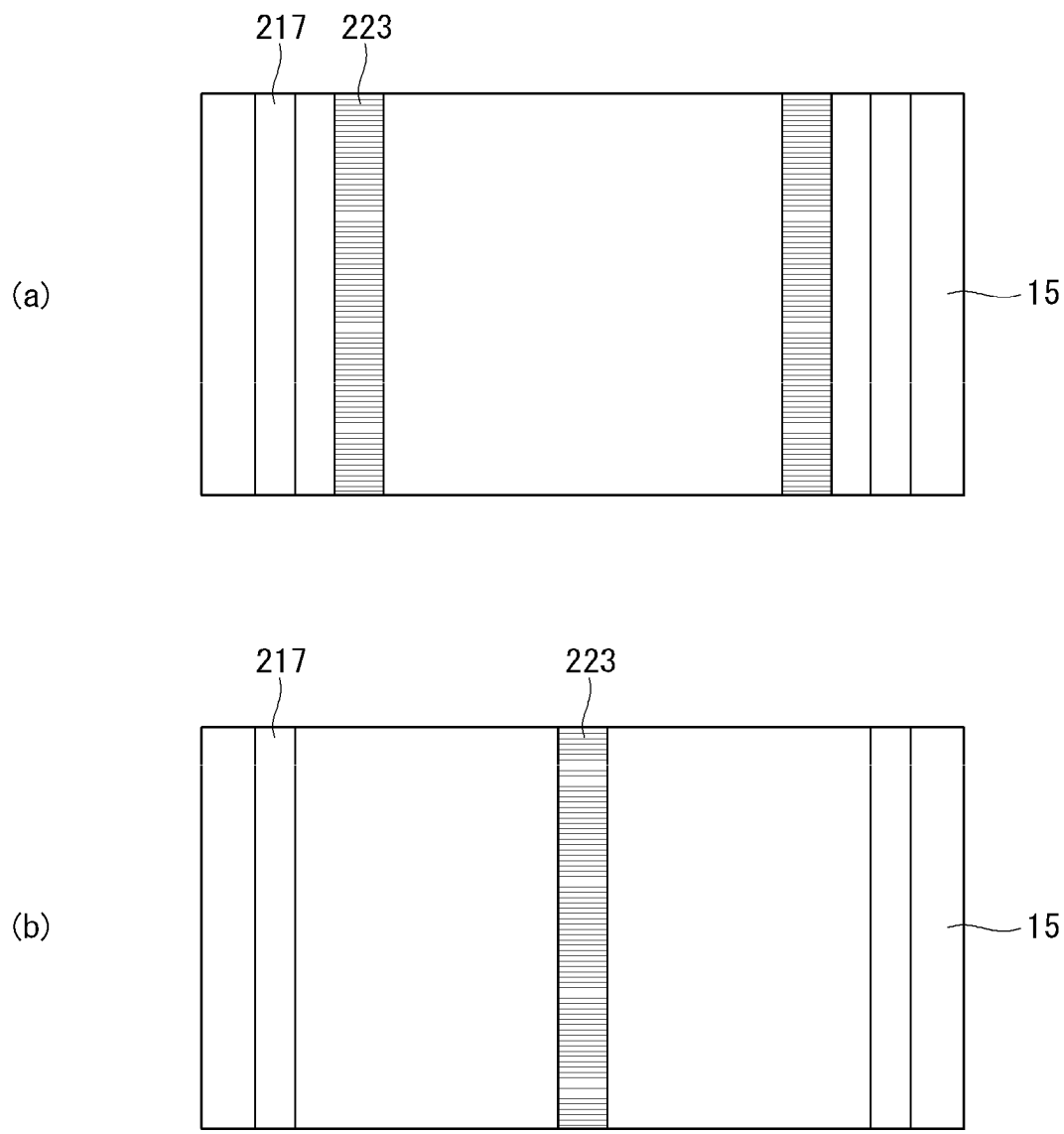
Figure 28:
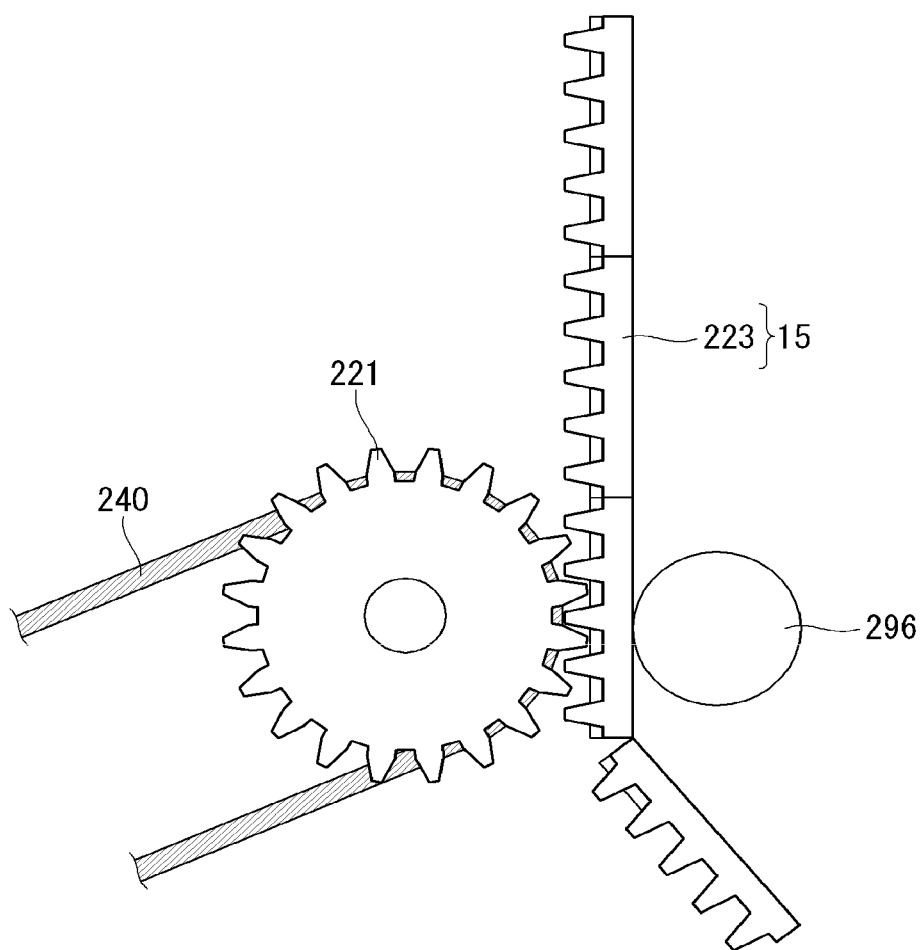

Referring to (a) of FIG. 27, in the display device according to the present invention, the rack gears 223 may be at an equal distance from the center of the module cover 15 in the first major axis direction and the second major axis direction, respectively. The rack gears 223 may be disposed closer to the center of the module cover 15 than the elastic pieces 217. That is, the rack gears may be disposed in a space between the elastic pieces 217. Since the rack gears 223 are disposed adjacent to the elastic pieces 217, the rack rears 223 may not be easily bent even by a great shock which may be imposed when the rack gears 223 are driven.

Referring to (b) of FIG. 27, a rack gear 223 may be arranged along with the center of the module cover 15. In the case where the rack gear 223 is disposed on the center of the module cover 15, it can be far from the elastic pieces 217, and thus, an elastic piece roller and the driving unit may not be in contact with each other, thereby reducing occurrence of malfunction, Referring to FIG. 28, in the display device according to the present invention, the pinion gear 221 and the rack gear 223 are engaged with each other. An assist roller 296 may be disposed opposite to the pinion gear 221 by reference to the module cover 15. The assist roller 296 may press the module cover 15 so as to cause the pinion gear 221 and the rack gear 223 to be engaged with each other in a fitted manner. The assist roller 296 is disposed on the opposite surface of the module cover 15 and thus may be in a circular shape not including teeth. If the assist roller 296 presses the module cover 15 too strongly, the module cover 15 may be cracked.

The display device according to the present invention may use the assist roller 296 to press the pinion gear 221 and the rack gear 223 to be engaged with each other in a fitted manner. Accordingly, rotation motions of the pinion gear 221 may be transferred to the rack gear 223.

Figure 29:
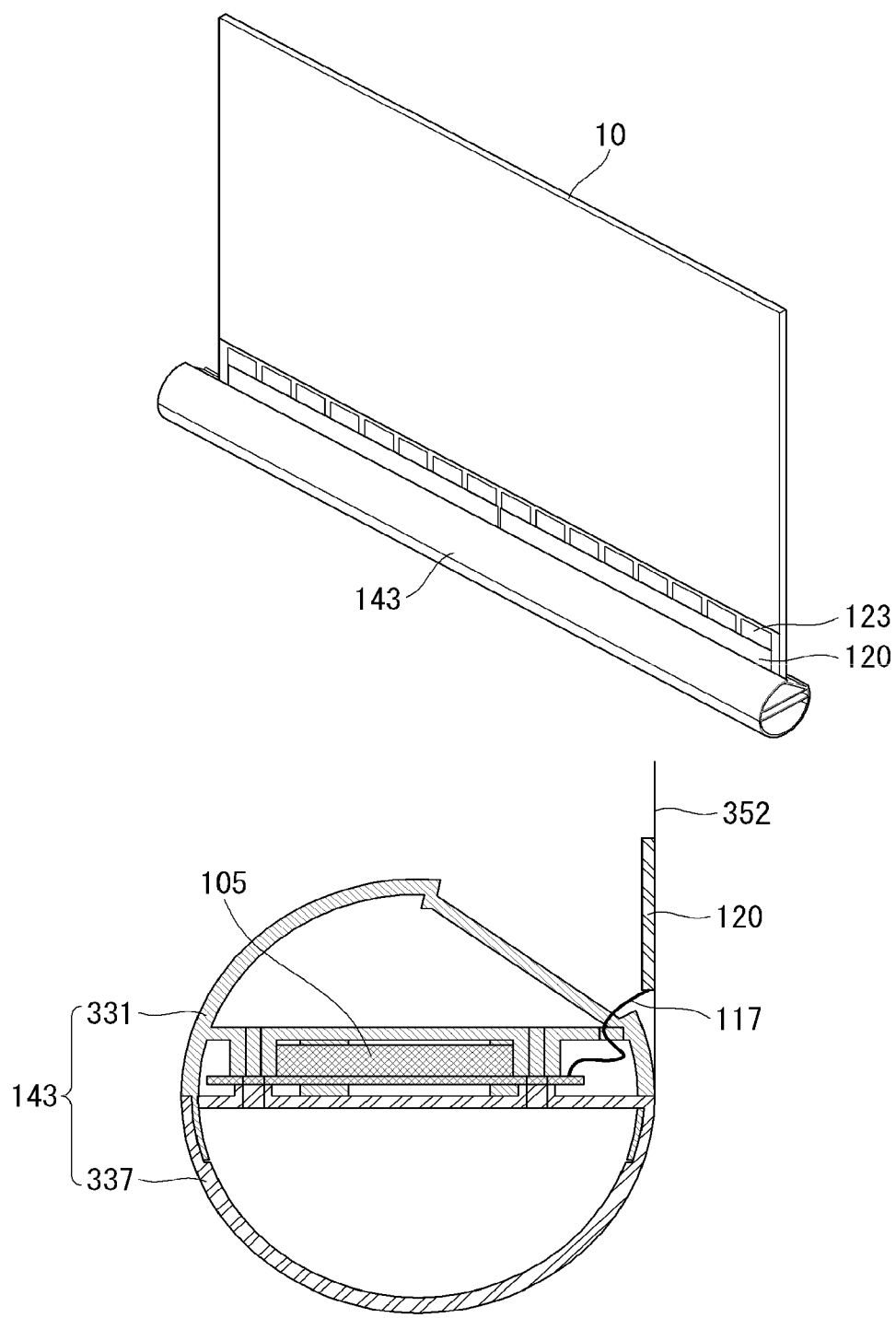

Referring to FIG. 29, in the display device according to the present invention, a timing controller board 105 may be mounted in the panel roller 143. By mounting the timing controller board 105 in the panel roller 143, it is possible to prevent twisting of an FFC cable 117 connected to a source PCB 120.

The panel roller 143 may include a top panel roller 331 and a bottom panel roller 337. The top panel roller 331 and the bottom panel roller 337 may be clamped by at least one screw. The timing controller board 105 may be mounted between the top panel roller 331 and the bottom panel roller 227. At least one screw makes the timing controller board 105 to be clamped to the top panel roller 331 and the bottom panel roller 337. Through a hole located at the top panel roller 331, the FFC cable 117 may be connected to the timing controller board 105 and the source PCB 120.

In the display device according to the present invention, the FFC cable 117 may not be twisted since the timing controller board 105 rotates along with the panel roller 143. In addition, the timing controller board 105 is mounted in the panel roller 143, so that a space may be saved.

Figure 30:
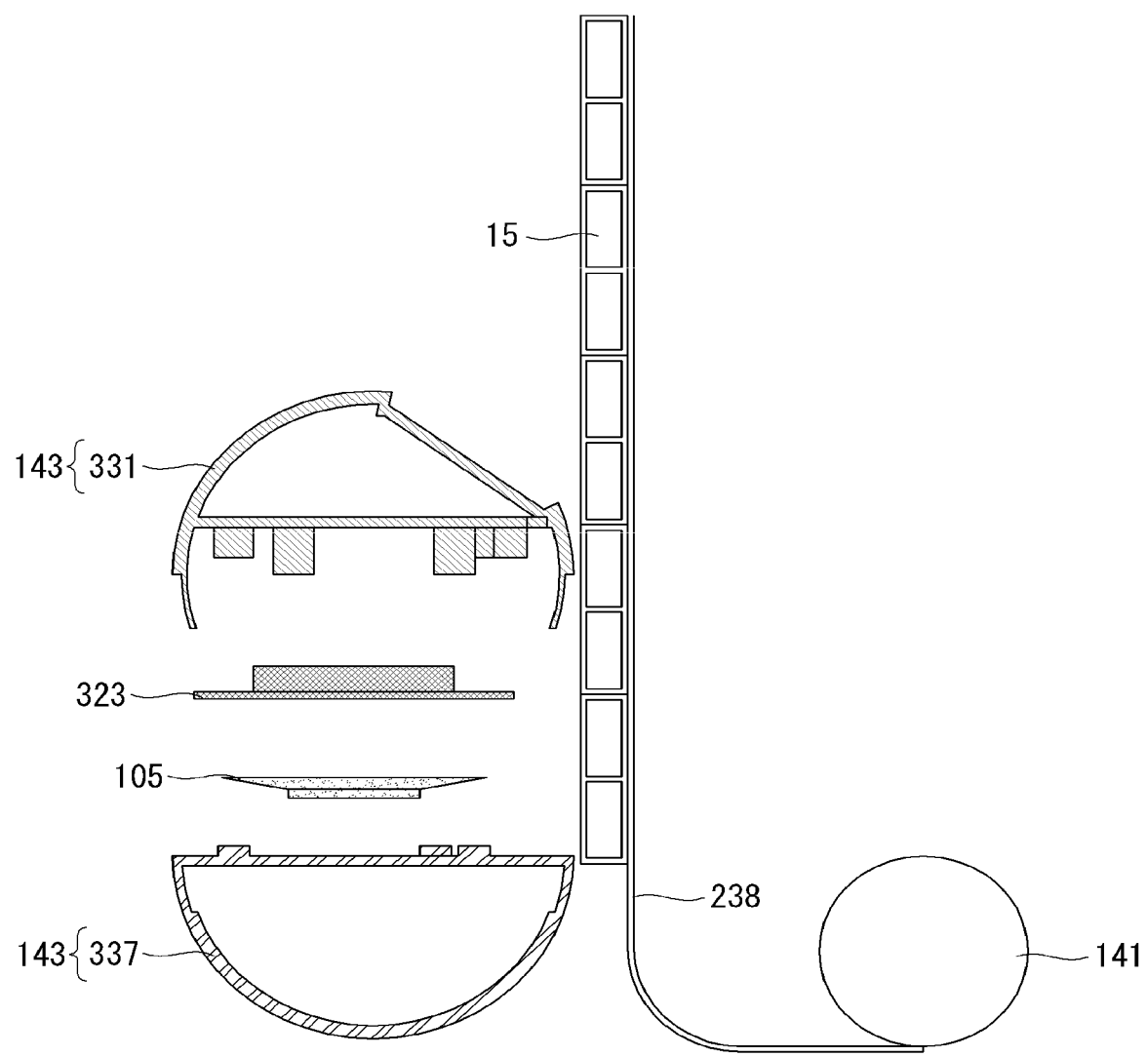
Figure 31:
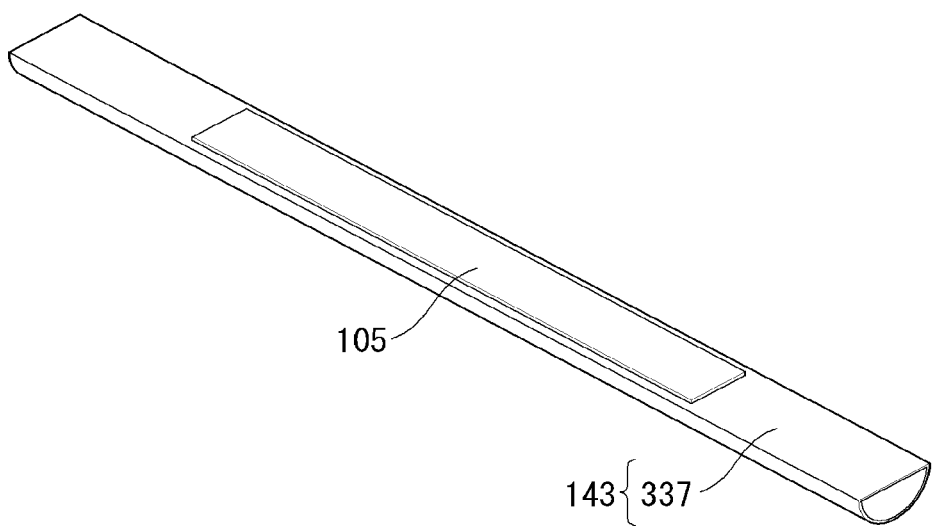
Figure 32:
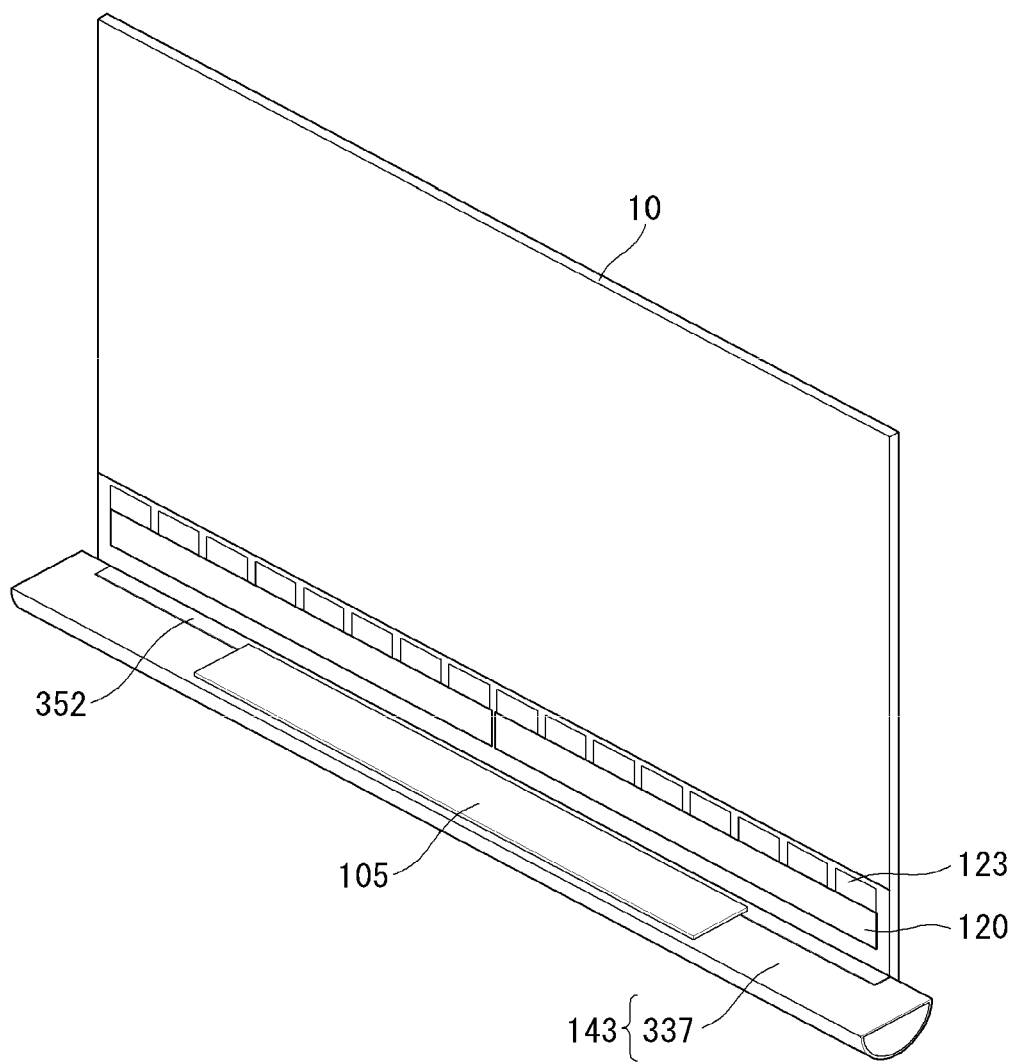
Figure 33:
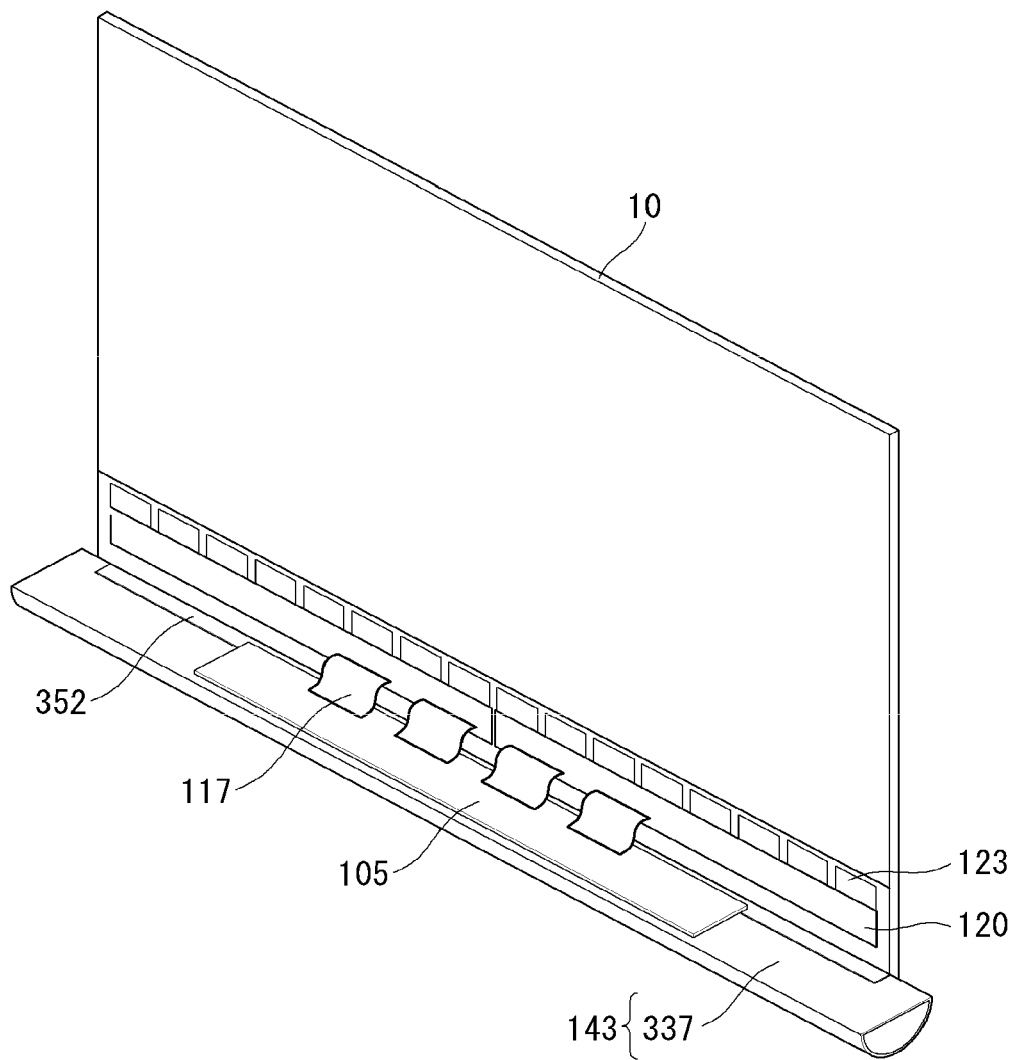
Figure 34:
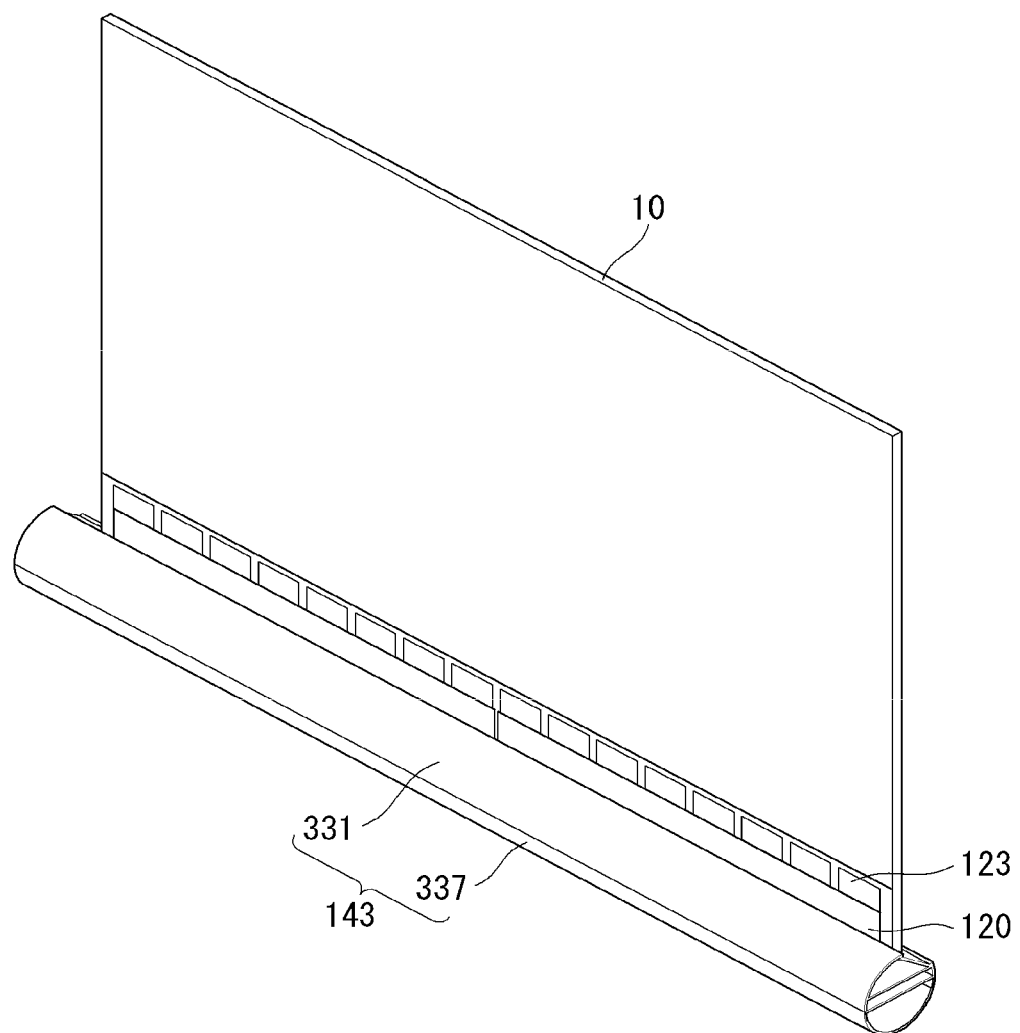

Referring to FIG. 30, in the display device according to the present invention, a board cover 323 may cover the timing controller board 105. The board cover 323 may protect the timing controller board 105 from any external shock. In addition, the board cover 323 may cause the top panel roller 331 and the bottom panel roller 337 to be combined with the timing controller board 105. That is, the board cover 323 may cover the timing controller board 105, while being combined with the top panel roller 331 and the bottom panel roller 337. How to be combined with the panel roller 331 is described in detail in the following.

Referring to FIGS. 31 to 34, the timing controller board 105 covered by the board cover 323 may be combined with the bottom panel roller 337. Specifically, both sides of the board cover 323 may be combined with the bottom panel roller 337.

Then, an extension sheet 352 connected to the display panel 10 may be combined with the bottom panel roller 337. On the extension sheet 352, the source PCB 120 and a source COF 123 may be settled. One side of the extension sheet 352 may be combined with the display panel 10, and the other side thereof may be combined with the bottom panel roller 337.

Then, the timing controller board 105 and the source PCB 120 may be connected to each other through the FFC cable 117. Specifically, the source PCB 120 may be coupled to one side of the FFC cable 117, and the timing controller board 105 may be coupled to the other side of the FFC cable 117.

Lastly, the top panel roller 331 may be settled on the bottom panel roller 337 which is combined with the timing controller board 105. Being combined with the bottom panel roller 337, the top panel roller 331 may be in a circular shape.

In the display device according to the present invention, the timing controller board 105 may be combined with the top panel roller 331 and the bottom panel roller 337, before the top panel roller 331 and the bottom panel roller 337 are combined. Accordingly, it is easier to mount the timing controller board 105 in the panel roller 143 than when the panel roller is provided as a single mold.

Figure 35:
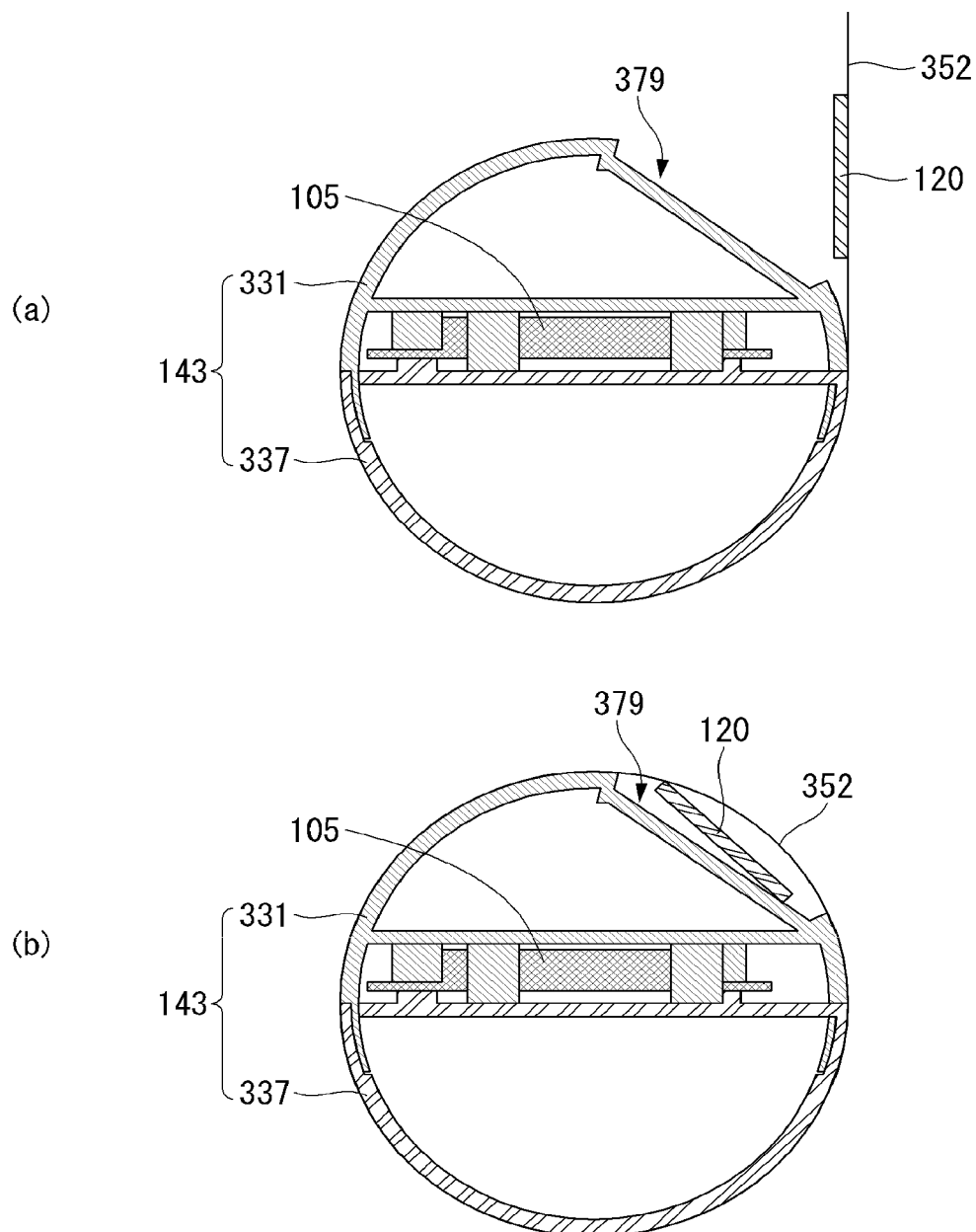

Referring to FIG. 35, a settling part 379 may be disposed on the circumference of the panel roller 143. That is, at least some portion of the circumference of the panel roller 143 has a step. The settling part 379 may be disposed in an area where the source PCB 120 and the panel roller 143 are in contact with each other when the panel roller 143 is rolling and unrolling. The settling part 379 may be in a shape where at least part of the circumference of the panel roller 143 is sunk.

When the panel roller 143 is unrolling, the source PCB 120 is settled in the settling part 379 and at least part of the source PCB 120 may be in contact with the panel roller 143. Accordingly, although the panel roller 143 rolls, the source PCB 120 may not be damaged.

In the display device according to the present invention, the settling part 379 may be disposed on the circumference of the panel roller 143. Accordingly, the panel roller 143 may be able to roll and unroll without damaging the source PCB 120 disposed on the panel extension sheet 352.

Figure 36:
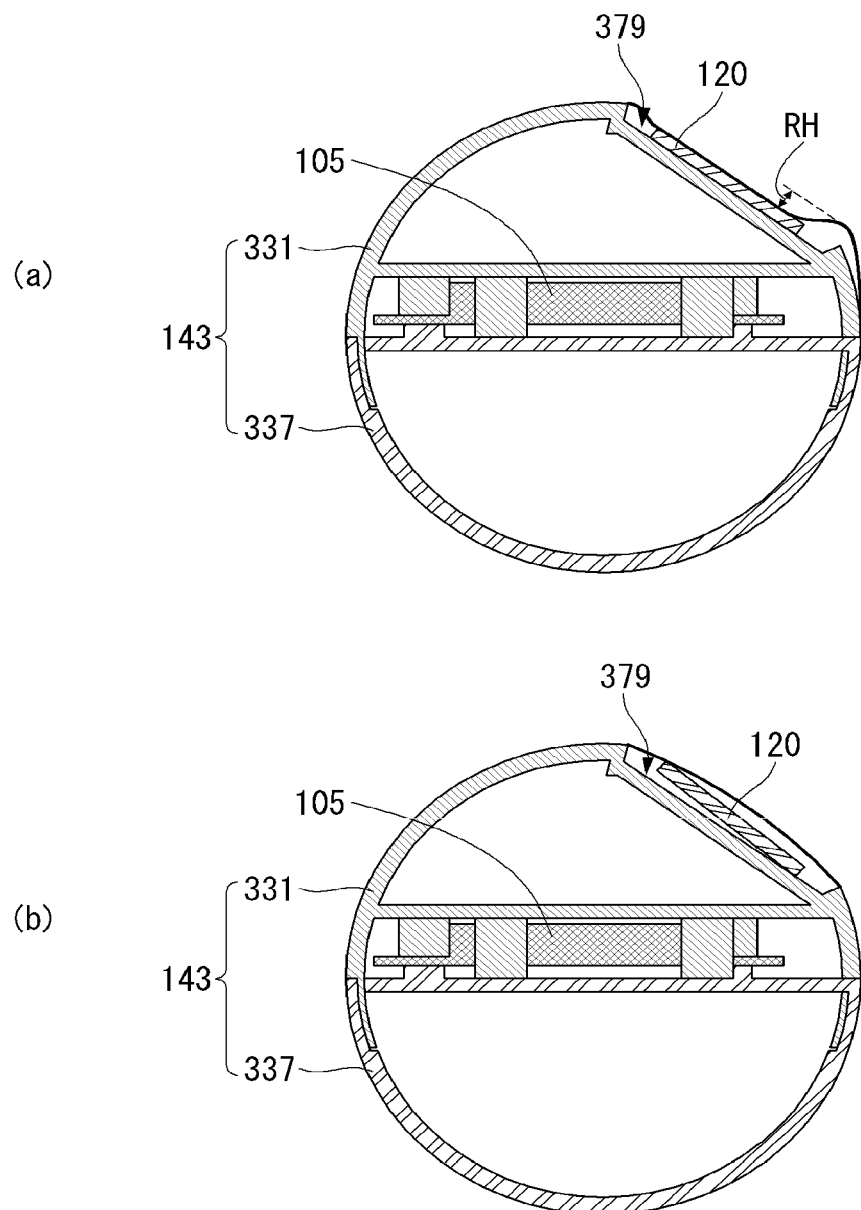

Referring to FIG. 36, in the display device according to the present invention, a part of the source PCB 120 may be combined with the panel extension sheet 352. If all parts of the source PCB 120 are combined with the panel extension sheet 352, the panel extension sheet 352 may be wound whilst being closely contacting the settling part 379 when the panel roller 143 is rolling. Accordingly, the panel extension sheet 352 in contact with the settling part 379 may be inwardly sunk to a first height RH compared to other circumferential areas. Since the panel extension sheet 352 is sunk, a display panel which would be wound above the panel extension sheet 352 may be also sunk. Accordingly, the display panel may be cracked.

On the other hand, if the source PCB 120 and the panel extension sheet 352 are partially attached to each other, only a part of the source PCB 120, which is not attached to the settling part 379, may be in contact with the settling part 379. Accordingly, the panel extension sheet 352 may not be sunk and the source PCB 120 may be disposed on the settling part 379. For example, if one side of the PCB 120 is attached to the panel extension sheet 32, the other side of the source PCB 120 may contact the settling part 379 so as to support the panel extension sheet 352. Accordingly, the panel extension sheet 352 may not be sunk but be able to be wound around the panel roller 143.

In the display device according to the present invention, only a part of the source PCB 120 may be attached to the panel extension sheet 352. Accordingly, the display panel may not be cracked.

Figure 37:
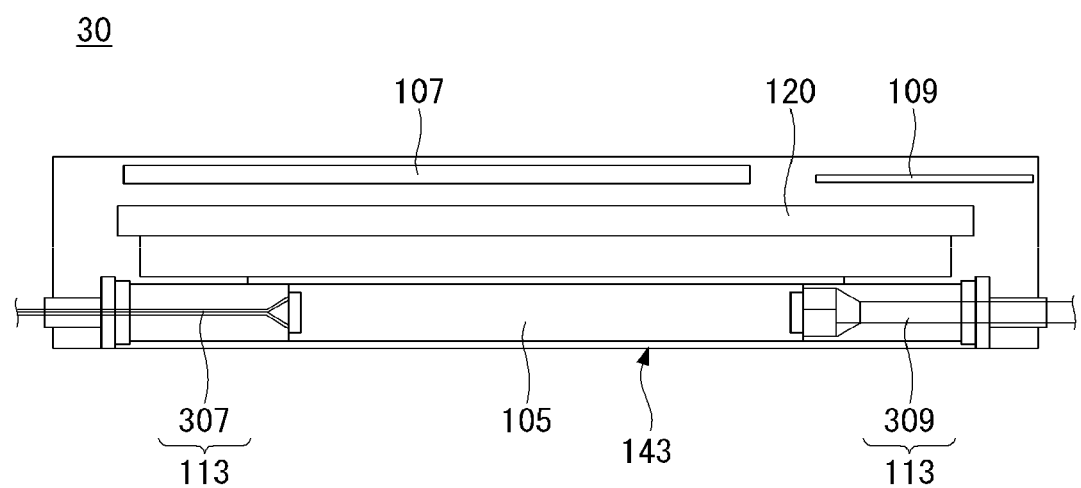

Referring to FIG. 37, the display device according to the present invention may have the timing controller board 105 mounted in the panel roller 143 on one side, and a main board 109 and a power supply 107 on the other side by reference to the center of the housing in which a display panel goes upward.

The timing controller board 105 may be connected to the main board 109 and the power supply 107. The timing controller board 105 may be connected to the main board 109 and the power supply 107 through a wiring electrode 113. Specifically, the wiring electrode 113 may include a first wiring electrode 307 connecting the timing controller board 105 and the power supply 107, and a second wiring electrode 309 connecting the timing controller board 105 and the main board 109.

For example, there may be a plurality of first wiring electrodes 307. In addition, the first wiring electrode 307 may be in a circular shape. The first wiring electrode 307 may connect the timing controller board 105 and the power supply 107 through an opening at the center of the rotational axis of the panel roller 143.

The second wiring electrode 309 may use an FFC cable connecting the timing controller board 105 and the source PCB 120. The second wiring electrode 309 may connect the timing controller board 105 and the main board 109 through an opening at the center of the rotational axis of the panel roller 143.

The first wiring electrode 307 and the second wiring electrodes 309 may be disposed opposite by reference to the timing controller board 105. The opening for the first wiring electrode 307 and the opening for the second wiring electrode 309 may be also disposed opposite to each other.

In the display device according to the present invention, the timing controller board 105 may be mounted in the panel roller 143, and the power supply 107 and the main board 109 may be disposed opposite by reference to a display panel. Accordingly, it is possible to save more space within the housing 30.

Figure 38:
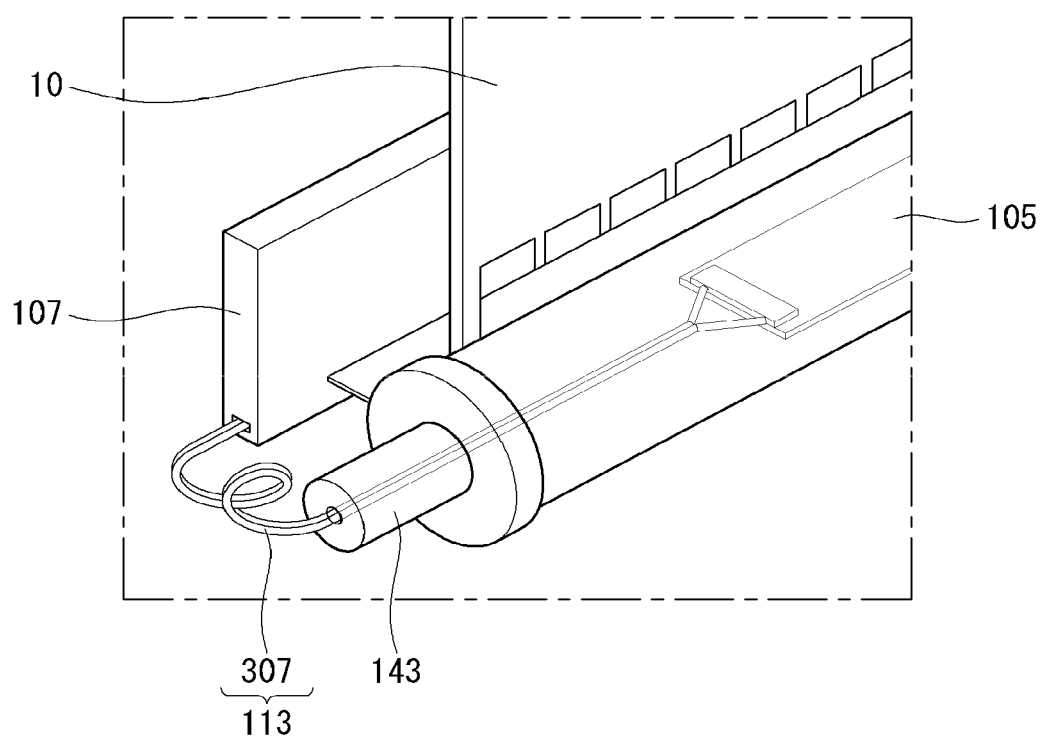
Figure 39:
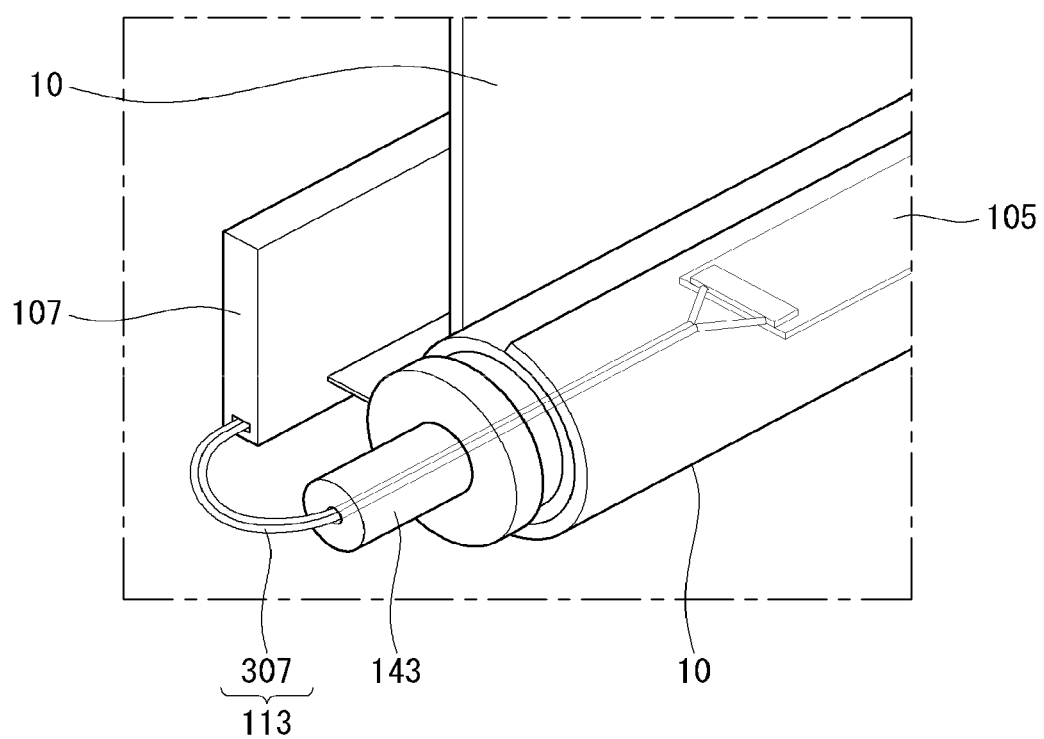

Referring to FIGS. 38 and 39, in the display device according to the present invention, the first winding electrode 307 may be wound by multiple times when the panel roller 143 is in the first state.

When the panel roller 143 is shifted from the first state to the second state, the first winding electrode 307 wound by multiple times may be unwound as the panel roller 143 rotates. If the panel roller 143 is in the second state, that is, if the panel roller 143 is completely rolled, the first winding electrode 307 may be unwound.

The first winding electrode 307 may have been wound as many as the number of times that the panel roller 143 has rotated to shift from the first state to the second state. A plurality of first winding electrodes 307 may be wound together.

In the display device according to the present invention, the first winding electrode 307 may be wound by multiple times in the first state. Accordingly, although the panel roller 143 rotates, electric connection may remain established normally.

Figure 40:
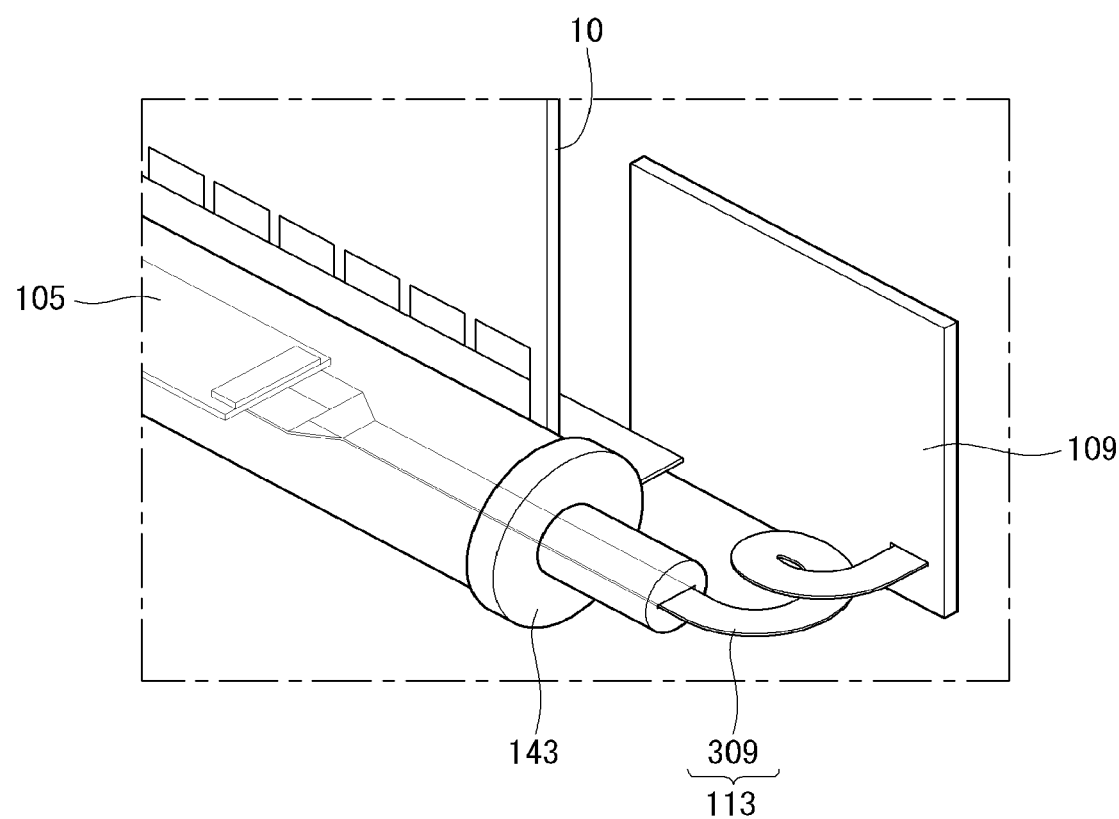
Figure 41:
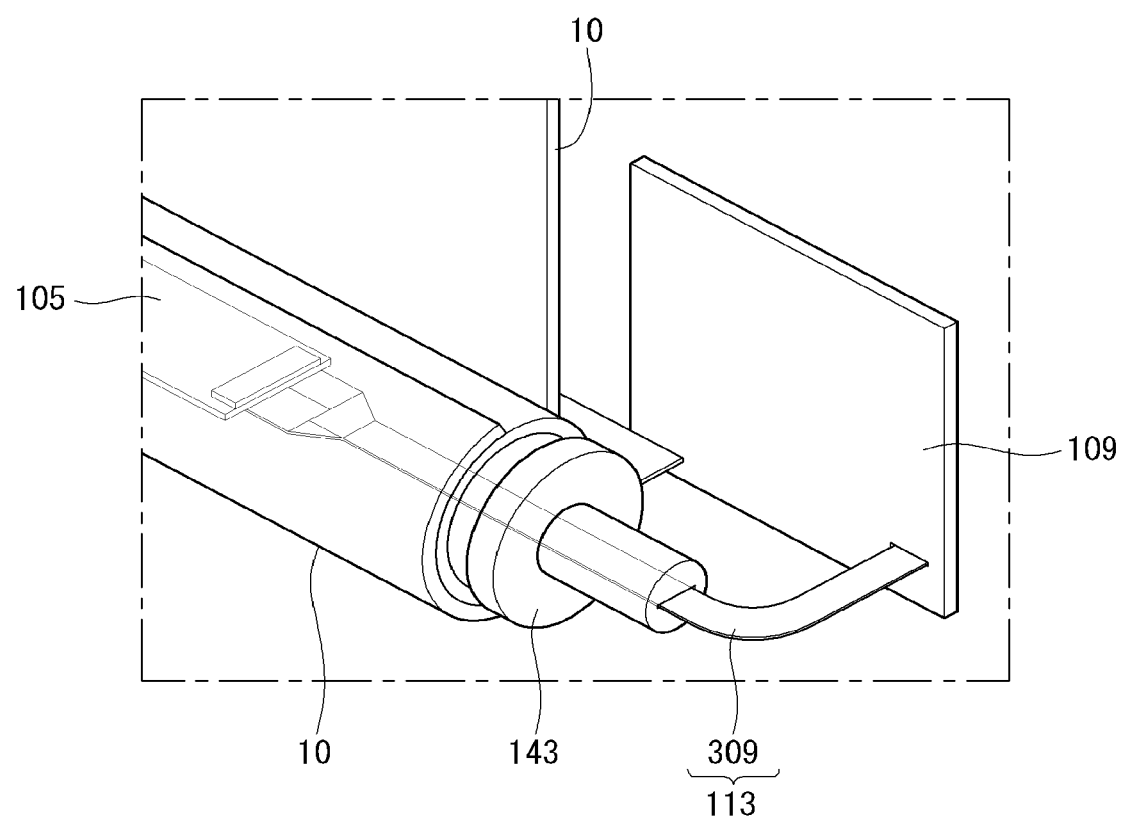

Referring to FIGS. 40 and 41, in the display device according to the present invention, the second winding electrode 309 may be wound by multiple times when the panel roller 143 is in the first state.

When the panel roller 143 is shifted from the first state to the second state, the second winding electrode 309 wound by multiple times may be unwound as the panel roller 143 rotates. If the panel roller 143 is in the second state, that is, if the panel roller 143 is completely rolled, the second winding electrode 309 may be unwound.

The second winding electrode 309 may be a FFC cable, and thus, the width of the second winding electrode 309 may be greater than that of the first winding electrode 307. Accordingly, it may be hard to wind the second winding electrode 309 than the first winding electrode 307. The second winding electrode 309 may have been wound as many as the number of times that the panel roller 143 has rotated to shift from the first state to the second state.

In the display device according to the present invention, the second winding electrode 309 may be wound by multiple times in the first state. Accordingly, although the panel roller 143 rotates, electric connection may remain established normally.

FIGS. 42 to 47 are diagrams illustrating a display device according to yet another exemplary embodiment of the present invention.

Figure 42:
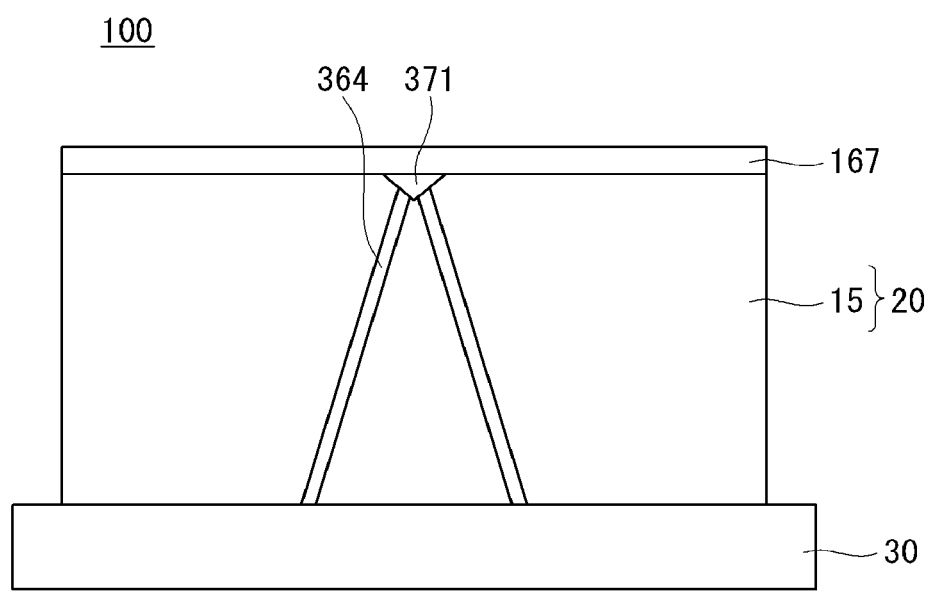
FIGS. 42 to 47 are diagrams illustrating a display device according to yet another exemplary embodiment of the present invention.

Referring to FIG. 42, in a display device 100 according to the present invention, two arm parts 364 may be combined with a top case 167. Specifically, the top case 167 may be combined with the two arm parts 364 through a supporting member 371. The arm parts 361 may be combined with the center of the top case 167. One side of each arm part 364 may be combined with the supporting member 371, and the other side thereof may be disposed in a housing 30. That is, the other side of each arm part 364 may be covered by the housing 30.

The supporting member 371 may be disposed at the center of the top case 167. The supporting member 371 may have an opening in a moving range of the arm parts 364 so as to let each arm part 364 move freely How to drive the arm parts 34 is described in detail in the following.

The arm parts 364 may push the top case 167 to cause a module cover 15 to go upward. Specifically, the arm parts 364 may push the supporting member 371 disposed at the center of the top case 167 to cause the module cover 15 to go upward.

In the display device 100 according to the present invention, the two arm parts 364 may be disposed at the center of the top case 167 to cause the module cover 15 to go upward. Accordingly, less force may be used to cause the module cover 15 to go upward.

Figure 43:
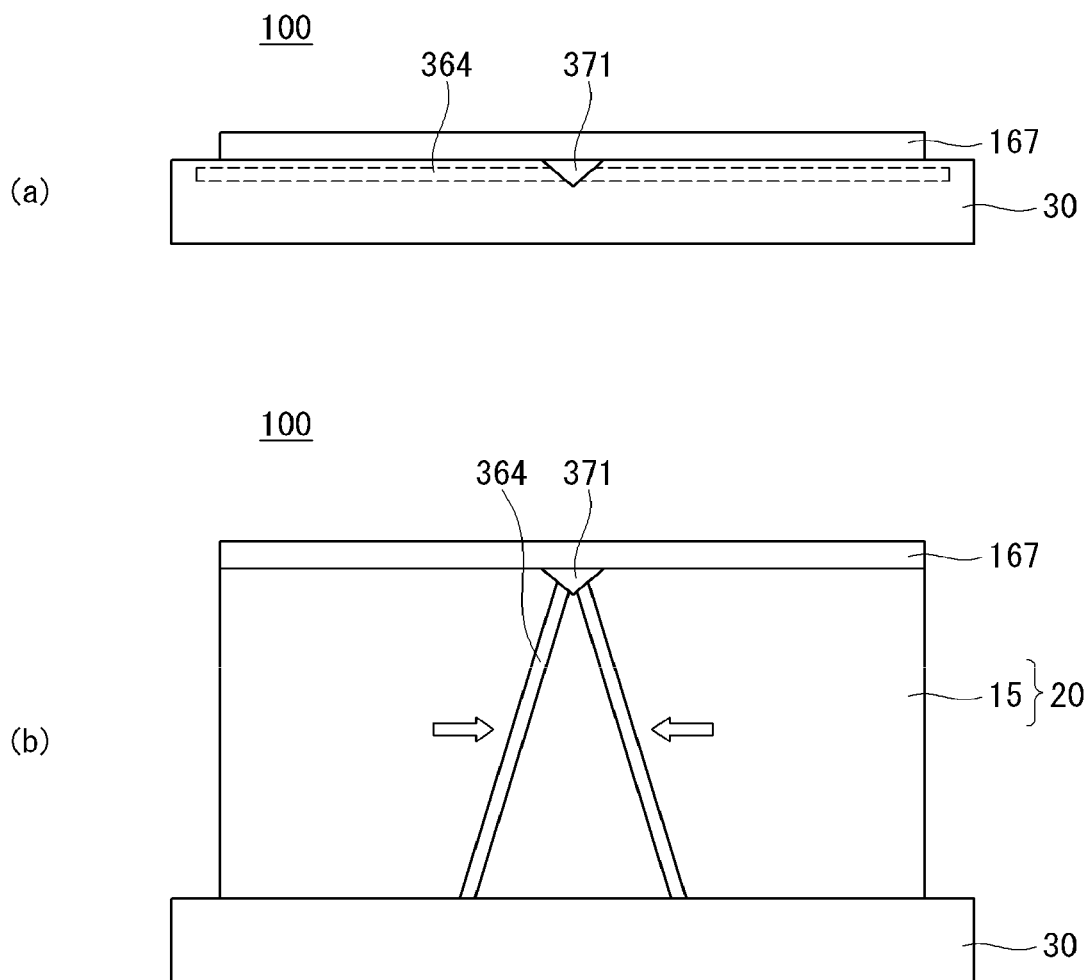

Referring to FIG. 43, in the first case in which the module cover 15 is inside the housing 30, the arm parts 364 may be laid in the major axis direction of the module cover 15. Accordingly, the arm parts 364 and the supporting member 371 may be disposed inside the housing 30 and thus may not be exposed outwardly.

When the first state is shifted to the second state in which the module cover 15 is exposed outwardly from the housing 30, a lower portion of each arm part 364 may be pressed toward the center of the module cover 15. As the lower portion of each arm part 364 is pressed, the module cover 15 may go upward.

Since an upper portion of each arm part 364 is fixed by the supporting member 371, the module cover 15 may be able to go upward when the lower portion of each arm part 364 is pressed toward the center of the module cover 15.

The display device 100 according to the present invention may cause the module cover 15 to go upward by pressing the lower portion of each arm part 364. Accordingly, less force may be lost than the case where the upper portion of each arm part 364 is pressed.

Figure 44:
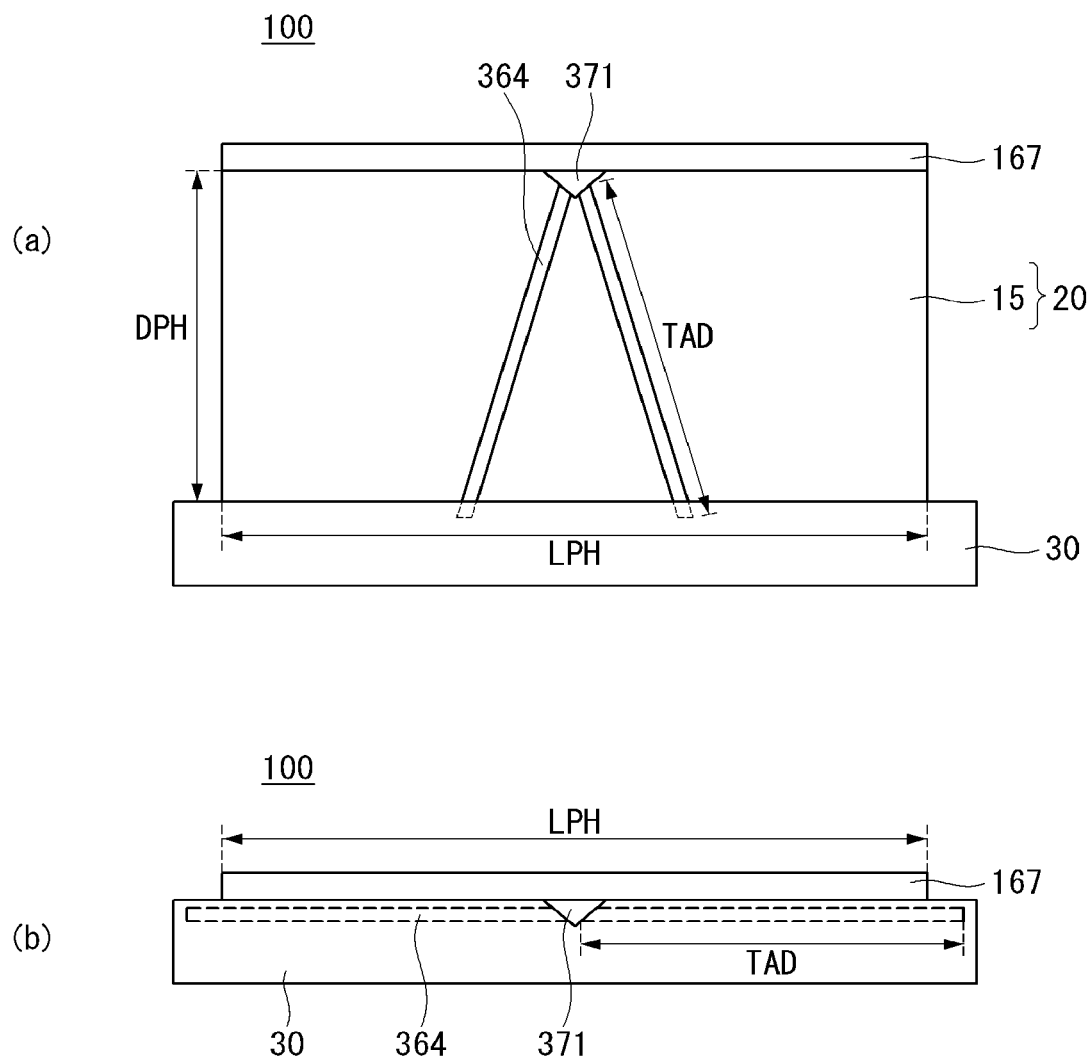

Referring to FIG. 44, in the display device 100 according to the present invention, a length TAD of an arm part 364 may be longer than a length of a minor axis DPH of the module cover 15. That is, the arm parts 364 may not stand up vertically in the second state. In the second state, the arm parts 364 and the housing 30 may form a triangle. Accordingly, even in the second state, the arm parts 364 may support the module cover 15 not to go downward.

The length TAD of an arm part 364 may be longer than half a length of a major axis LPH of the module cover 15. That is, the lower portion of each arm part 364 may exceed the minor axis of the module cover 15 in the first state. Accordingly, a length of a major axis of the housing 30 may be longer than the length of the major axis LPH of the module cover 15.

In the display device 100 according to the present invention, the length TAD of each arm part 364 may be longer than the length of the minor axis DPH. Accordingly, even in the second state, the arm parts 364 may support the module cover 15 without any damage.

Figure 45:
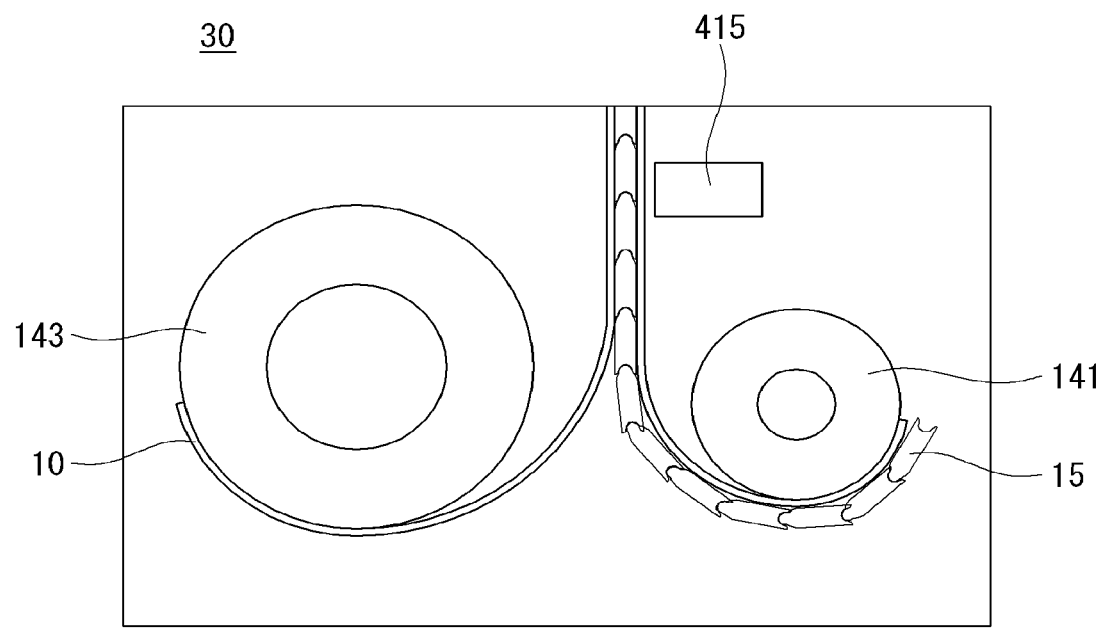

Referring to FIG. 45, in the display device according to the present invention, a panel roller 143 and an apron roller 141 may be disposed opposite to each other. Accordingly, a display panel 10 and the module cover 15 may be enabled to be wound or unwound without disrupting each other.

A guide rail 415 may be disposed on the apron roller 141. The guide rail 415 may be disposed on the rear surface of the module cover 15. The guide rail 415 may be spaced apart from the module cover 15 not to disrupt the apron roller 141 when the apron roller 141 is rolling or unrolling.

The guide rail 415 may be a section where a lower portion of an arm part that causes the module cover 15 to go upward moves. Specific shape of the guide rail 415 is described in the following.

In the display device according to the present invention, the guide rail 415 may be disposed to cause the module cover 15 to go upward. Accordingly, it is possible to cause the module cover 15 to go upward with much lesser force.

Figure 46:
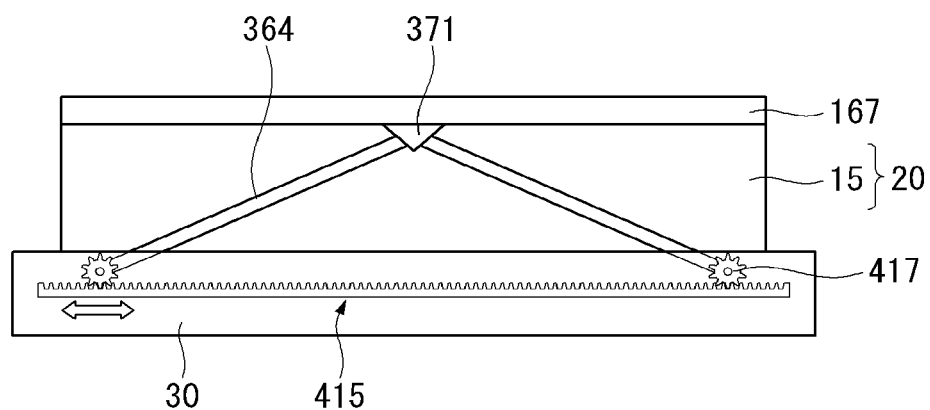

Referring to FIG. 46, in the display device 100 according to the present invention, one side of the guide rail 415 is projected at predetermined intervals and may be engaged with teeth of a moving roller 417 disposed on the lower portion of each arm part 364. That is, the guide rail 415 may act as a rack gear and the moving roller 417 may acts as a pinion gear.

When the first state is shifted to the second state, the moving roller 417 may rotatably move toward the center of the module cover 15 while being engaged with the guide rail 415. As the moving roller 417 moves toward the center of the module cover 15, the arm parts 364 may push the top case 167 upward. The lower portion of each arm part 364 may not be fixed to the moving roller 417 but enabled to rotate. Accordingly, if the moving roller 417 rotatably moves toward the center of the module cover 15, the lower portion of each arm part 364 may move toward the center of the module cover 15 to thereby push the top case 167 upward.

In the display device 100 according to the present invention, the guide rail 415 and the moving roller 417 may be in the shape of gears engaged with each other. Accordingly, the arm parts 364 may be enabled to push the top case 167 with greater force.

Figure 47:
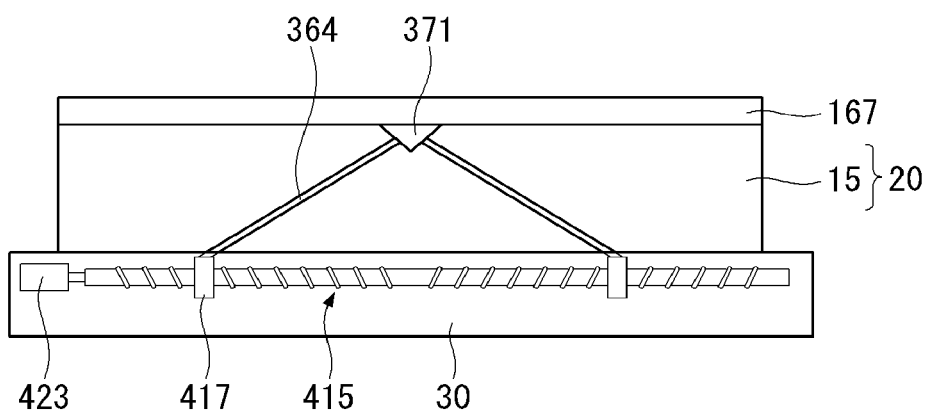

Referring to FIG. 47, in the display device 100 according to the present invention, the guide rail 415 may be in a screw shape. As a motor 423 connected to one side of the guide rail 415 rotates, the guide rail 415 may rotates. The motor 423 and the guide rail 415 may rotate in the same direction.

The spiral direction of the screw may be changed to an opposite direction by reference to the module cover 15. Accordingly, the moving rollers 417 on both sides of the guide rail 415 may move toward the center of the module cover 15.

As the guide rail 415 rotates, the moving roller 417 may move along the guide rail 415. Specifically, if the motor 415 rotates in the first direction, the guide rail 415 may rotate in the first direction. Accordingly, the moving rollers 417 on both sides of the guide rail 415 may move toward the center of the module cover 15. If the motor 415 rotates in the second direction, the guide rail 415 may rotate in the second direction. Accordingly, the moving rollers 417 may move toward the side parts of the module cover 15.

The lower portions of the arm parts 364 may be connected to the moving roller 417. Accordingly, if the moving roller 417 moves toward the center of the module cover 15, the arm parts 364 may push the top case 167 upward.

In the display device 100 according to the present invention, the guide rail 415 may be in a screw shape. Accordingly, the arm parts 364 may be driven easily and may operate accurately.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a housing;
a roller in the housing;
a display panel windable around the roller and having a front side and a rear side;
a module cover covering the rear side of the display panel;
a support link including:
a lower support link pivotally connected to the housing,
an upper support link pivotally connected to an upper part of the module cover, and
a joint pivotally connected to a lower part of the upper support link and pivotally connected to an upper part of the lower support link; and
a motor assembly installed in the housing,
wherein the motor assembly pivots the lower support link, and
wherein the motor assembly includes:
a motor on a bottom surface of the housing, and
a decelerator engaged with the motor to receive rotational energy from the motor.

2. The display device of claim 1, further comprising:
an apron roller in the housing,
wherein the module cover is windable around the apron roller.

3. The display device of claim 1, further comprising:
a second roller in the housing; and a third roller in the housing and pressing the module cover,
wherein the module cover is windable around the second roller.

4. The display device of claim 1, further comprising:
a magnet provided on the module cover,
wherein the display panel includes a metal material.

5. The display device of claim 1, further comprising:
a top bar coupled to an upper portion of the module cover; and
a top case covering the top.

6. The display device of claim 1, wherein a first gear is formed at an upper part of the lower support link and a second gear is formed at a lower part of the upper support link, and the first gear is engaged with the second gear.

7. The display device of claim 1, further comprising:
an assist link providing the lower support link with pushing force,
wherein the assist link comprises:
a joint part pivotally connected to the lower support link;
a column member receiving the joint part and pivotally connected to the housing; and
a spring member in the column member and providing the joint part with pushing force.

8. The display device of claim 1, further comprising:
a pinion gear; and
a motor in the housing, the motor driving the pinion gear,
wherein the module cover includes a rack gear at a rear surface of the module cover, and
wherein the pinion gear is engaged with the rack gear.

9. The display device of claim 1, further comprising:
an elastic piece; and
an insertion guide installed in the housing, the insertion guide supporting the elastic piece,
wherein the module cover comprises:
a groove formed on a rear surface of the module cover; and
a fixing member protrude on the groove,
wherein the elastic piece is positioned in the groove and supported by the fixing member.

10. The display device of claim 1, further comprising:
a timing controller board,
wherein the roller comprises:
a top; and
a bottom coupled to the top,
wherein the timing controller board is between the top and the bottom.

11. The display device of claim 10, wherein the top is elongated in the housing and the bottom is elongated along the top.

12. The display device of claim 10, further comprising:
an extension sheet connecting the roller and the display panel;
a source PCB on the extension sheet; and
a FFC cable connecting the timing controller board and the source PCB,
wherein a settling part is formed at the roller, and
wherein the source PCB is seated in the settling part.

13. The display device of claim 12, wherein the top includes a settling part depressed and extends along a longitudinal direction of the top.

14. The display device of claim 13, wherein the source PCB is received in the settling part when the display module is wound around the roller.

15. The display device of claim 10, further comprising:
a power supply;
main board;
a first wiring electrode connecting the power supply and the timing controller board; and
a second wiring electrode connecting the main board and the timing controller board.

16. The display device of claim 1, further comprising:
a guide rail in the housing;
a moving roller movable on the guide rail;
a supporting member coupled to an upper portion of the module cover; and
arm parts connecting the supporting member and the moving roller.

17. The display device of claim 1, wherein the decelerator is covered by a first cover which is different from a second cover for the motor.

18. The display device of claim 1, wherein if the motor rotates in a direction, the decelerator rotates in the same direction.

19. The display device of claim 1, wherein the lower support link is connected to the decelerator directly.

20. The display device of claim 19, wherein if the decelerator rotates in a direction, an angle of the lower support link with respect to the ground changes according to the direction.

21. The display device of claim 1, wherein the motor assembly includes a first motor assembly and a second motor assembly, and
wherein the first motor assembly is installed on one side corner of the bottom surface of the housing,
wherein the second motor assembly is installed on the other side corner of the bottom surface of the housing.

* * * * *